United States Patent
Wang et al.

(10) Patent No.: US 12,389,790 B2
(45) Date of Patent: Aug. 12, 2025

(54) ORGANIC ELECTROLUMINESCENT MATERIAL AND DEVICE

(71) Applicant: BEIJING SUMMER SPROUT TECHNOLOGY CO., LTD., Beijing (CN)

(72) Inventors: Tao Wang, Beijing (CN); Chi Yuen Raymond Kwong, Beijing (CN); Chuanjun Xia, Beijing (CN)

(73) Assignee: BEIJING SUMMER SPROUT TECHNOLOGY CO., LTD, Beijing (CN)

( * ) Notice: Subject to any disclaimer, the term of this patent is extended or adjusted under 35 U.S.C. 154(b) by 814 days.

(21) Appl. No.: 17/248,964

(22) Filed: Feb. 16, 2021

(65) Prior Publication Data

US 2021/0280802 A1    Sep. 9, 2021

(30) Foreign Application Priority Data

Feb. 20, 2020    (CN) .......................... 202010104721.2

(51) Int. Cl.
*C07F 15/00*    (2006.01)
*C09K 11/06*    (2006.01)
(Continued)

(52) U.S. Cl.
CPC ....... *H10K 85/342* (2023.02); *C07F 15/0033* (2013.01); *C09K 11/06* (2013.01);
(Continued)

(58) Field of Classification Search
CPC ........ H10K 85/341–348; H10K 85/342; C07F 15/0033; C09K 2211/185
See application file for complete search history.

(56) References Cited

U.S. PATENT DOCUMENTS 5,703,436 A    12/1997    Forrest et al.
5,707,745 A    1/1998    Forrest et al.
(Continued)

FOREIGN PATENT DOCUMENTS

CN    1374315 A    10/2002
CN    1802382 A    7/2006
(Continued)

OTHER PUBLICATIONS

CN-110642893-A—translation (Year: 2020).*
(Continued)

*Primary Examiner* — Jennifer A Boyd
*Assistant Examiner* — Rachel Simbana
(74) *Attorney, Agent, or Firm* — Alston & Bird LLP

(57) ABSTRACT

Disclosed is an organic electroluminescent material and device. The organic electroluminescent material is a novel metal complex that comprises a ligand having a fluorene structure and a ligand having a dibenzofuran, dibenzothiophene, or dibenzoselenophene structure, and has a general formula of $M(L_a)_m(L_b)_n(L_c)_q$, where the ligand $L_a$ has a structure represented by Formula IA, the ligand $L_b$ has a structure represented by Formula IB, and the ligand $L_c$ is a monoanionic bidentate ligand. The metal complex may be used as the light-emitting material in the organic electroluminescent device. These novel compounds can greatly improve the device efficiency and provide better device performance. Further provided are an electroluminescent device and a compound formulation.

14 Claims, 1 Drawing Sheet

(51) Int. Cl.
*H10K 50/11* (2023.01)
*H10K 85/30* (2023.01)
*H10K 101/00* (2023.01)
*H10K 101/10* (2023.01)

(52) U.S. Cl.
CPC ............... *C09K 2211/1029* (2013.01); *C09K 2211/1033* (2013.01); *C09K 2211/185* (2013.01); *H10K 50/11* (2023.02); *H10K 2101/90* (2023.02)

(56) References Cited

U.S. PATENT DOCUMENTS

| | | | |
|---|---|---|---|
| 5,844,363 | A | 12/1998 | Gu et al. |
| 6,097,147 | A | 8/2000 | Baldo et al. |
| 6,303,238 | B1 | 10/2001 | Thompson et al. |
| 7,279,704 | B2 | 10/2007 | Walters et al. |
| 7,968,146 | B2 | 6/2011 | Wagner et al. |
| 2003/0068535 | A1* | 4/2003 | Takiguchi ............ C07F 15/0033 556/136 |
| 2003/0230980 | A1 | 12/2003 | Forrest et al. |
| 2004/0174116 | A1 | 9/2004 | Lu et al. |
| 2008/0210930 | A1 | 9/2008 | Kamatan et al. |
| 2008/0299414 | A1* | 12/2008 | Watanabe ............ H10K 85/342 428/690 |
| 2012/0061654 | A1 | 3/2012 | Rayabarapu et al. |
| 2012/0104373 | A1 | 5/2012 | Inoue et al. |
| 2013/0168656 | A1 | 7/2013 | Tsai et al. |
| 2014/0027733 | A1 | 1/2014 | Zeng et al. |
| 2015/0090981 | A1* | 4/2015 | Xia ...................... C09K 11/06 546/4 |
| 2015/0236276 | A1 | 8/2015 | Boudreault et al. |
| 2015/0349273 | A1 | 12/2015 | Hung et al. |
| 2016/0093808 | A1 | 3/2016 | Adamovich et al. |
| 2016/0111661 | A1 | 4/2016 | Boudreault et al. |
| 2016/0240800 | A1 | 8/2016 | Ma et al. |
| 2016/0254460 | A1 | 9/2016 | Lin et al. |
| 2016/0359122 | A1 | 12/2016 | Boudreault et al. |
| 2016/0380216 | A1 | 12/2016 | Tsai et al. |
| 2018/0026209 | A1 | 1/2018 | Stoessel et al. |
| 2019/0127406 | A1 | 5/2019 | Xia |
| 2019/0225635 | A1 | 7/2019 | Xia |

FOREIGN PATENT DOCUMENTS

| | | | | |
|---|---|---|---|---|
| CN | 105636971 | A | 6/2016 | |
| CN | 107759638 | A | 3/2018 | |
| CN | 108822154 | A | 11/2018 | |
| CN | 110256499 | A | 9/2019 | |
| CN | 110642893 | A * | 1/2020 | ........ C07F 15/0033 |
| KR | 2006027323 | A * | 3/2006 | ........ C07F 15/002 |
| WO | 2019/221484 | A1 | 11/2019 | |

OTHER PUBLICATIONS

KR-2006027323-A—translation (Year: 2006).*
Tang, C. W., et al., "Organic electroluminescent diodes", Applied Physics Letter, Sep. 21, 1987, pp. 913-915, vol. 51, No. 12, American Institute of Physics, US.
Uoyama, Hiroki, et al., "Highly efficient organic light-emitting diodes from delayed fluorescence" (Research Letter), Nature, Dec. 13, 2012, pp. 234-240 (Methods included), vol. 492, Macmillan Publishers Ltd., US.
CN Office Action Mailed on Apr. 8, 2022 for CN Application No. 202010104721.
CN Search report Mailed on Apr. 1, 2022 for CN Application No. 202010104721.
English Translation of CN Office Action Mailed on Apr. 8, 2022 for CN Application No. 202010104721.

* cited by examiner

ORGANIC ELECTROLUMINESCENT MATERIAL AND DEVICE

CROSS-REFERENCE TO RELATED APPLICATIONS

This application claims priority to Chinese Application No. 202010104721.2, filed Feb. 20, 2020, the contents of which are hereby incorporated herein in its entirety by reference.

TECHNICAL FIELD

The present disclosure relates to compounds for organic electronic devices, for example, organic light-emitting devices. More particularly, the present disclosure relates to a metal complex which is a novel metal complex comprising a ligand of fluorene structure and a ligand of dibenzofuran, dibenzothiophene and dibenzoselenophene structure, and also relates to an organic electroluminescent device comprising the metal complex and a compound formulation.

BACKGROUND

Organic electronic devices include, but are not limited to, the following types: organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

In 1987, Tang and Van Slyke of Eastman Kodak reported a bilayer organic electroluminescent device, which comprises an arylamine hole transporting layer and a tris-8-hydroxyquinolato-aluminum layer as the electron and emitting layer (Applied Physics Letters, 1987, 51 (12): 913-915). Once a bias is applied to the device, green light was emitted from the device. This device laid the foundation for the development of modern organic light-emitting diodes (OLEDs). State-of-the-art OLEDs may comprise multiple layers such as charge injection and transporting layers, charge and exciton blocking layers, and one or multiple emissive layers between the cathode and anode. Since the OLED is a self-emitting solid state device, it offers tremendous potential for display and lighting applications. In addition, the inherent properties of organic materials, such as their flexibility, may make them well suited for particular applications such as fabrication on flexible substrates.

The OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of the fluorescent OLED is only 25%. This limitation hindered the commercialization of OLED. In 1997, Forrest and Thompson reported phosphorescent OLED, which uses triplet emission from heavy metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. A small molecule refers to any organic or organometallic material that is not a polymer. The molecular weight of the small molecule can be large as long as it has well defined structure. Dendrimers with well-defined structures are considered as small molecules. Polymer OLEDs include conjugated polymers and non-conjugated polymers with pendant emitting groups. Small molecule OLED can become the polymer OLED if post polymerization occurred during the fabrication process.

There are various methods for OLED fabrication. Small molecule OLEDs are generally fabricated by vacuum thermal evaporation. Polymer OLEDs are fabricated by solution process such as spin-coating, inkjet printing, and slit printing. If the material can be dissolved or dispersed in a solvent, the small molecule OLED can also be produced by solution process.

The emitting color of the OLED can be achieved by emitter structural design. An OLED may comprise one emitting layer or a plurality of emitting layers to achieve desired spectrum. In the case of green, yellow, and red OLEDs, phosphorescent emitters have successfully reached commercialization. Blue phosphorescent device still suffers from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent OLEDs at high brightness remains a problem. In addition, it is desirable to have more saturated emitting color, higher efficiency, and longer device lifetime.

US20080210930A1 discloses a metal complex including a fluorenyl-quinoline or fluorenyl-isoquinoline ligand, where the specific examples include

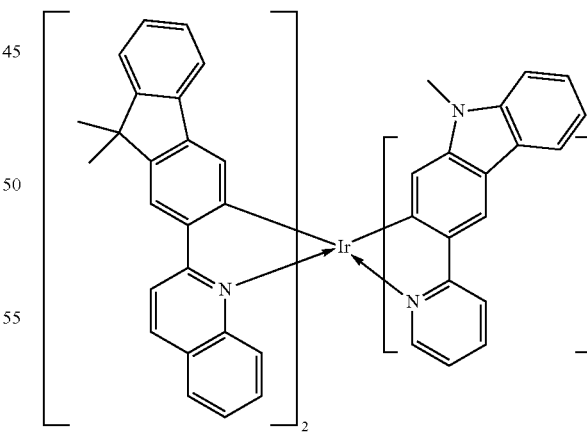

It does not disclose or teach the special effects of introducing structural units such as dibenzofuran and dibenzothiophene in the metal complex having a fluorenyl ligand.

US20180026209A1 discloses a metal complex comprising a hexadentate ligand having a core of mesitylene and similar structure. Specific examples of the ligand include

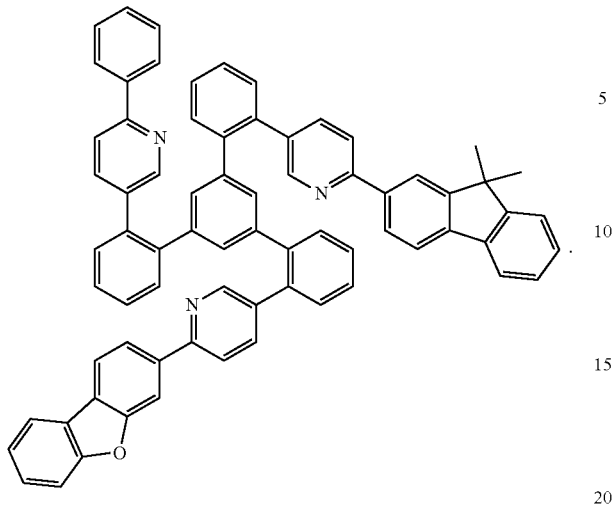

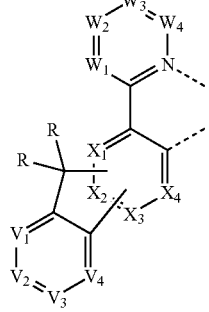

Formula IA

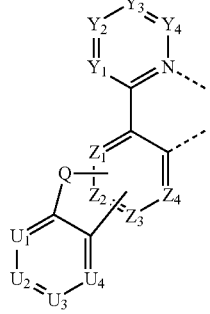

Formula IB

Obviously, the metal complex disclosed therein must have a hexadentate ligand, but is not used in devices and thus are not compared with the corresponding material, i.e., the complex in which fluorenyl is replaced by phenyl. In addition, the disclosure fails to disclose and teach the application when three bidentate ligands do not form a hexadentate ligand.

The existing phosphorescent iridium complexes such as Ir(PPy)$_3$ can be used as green phosphorescent dopants, but their properties need to be further improved to meet the increasing performance demands, especially to provide a more effective means of controlling the emission wavelength and a method of improving the quantum efficiency of the material.

SUMMARY

The present disclosure aims to provide a series of novel metal complexes containing a ligand having a fluorene structure and a ligand having a dibenzofuran, dibenzothiophene or dibenzoselenophene structure to solve at least part of the above-mentioned problems. The metal complexes can be used as emissive materials in the organic electroluminescent device. These novel compounds can greatly improve the device efficiency and provide better device performance.

According to an embodiment of the present disclosure, a metal complex is disclosed, which has a general formula of $M(L_a)_m(L_b)_n(L_c)_q$, wherein $L_a$, $L_b$, and $L_c$ are the first ligand, the second ligand and the third ligand coordinated to the metal M, respectively; wherein $L_c$ is a monoanionic bidentate ligand, and $L_a$ is the same as or different from the $L_a$ or the $L_b$; wherein $L_a$, $L_b$, and $L_c$ can be optionally joined to form a tetradentate ligand;

wherein the metal M is selected from a metal with a relative atomic mass greater than 40;

wherein m is 1 or 2, n is 1 or 2, q is 0 or 1, and m+n+q equals to the oxidation state of the metal M; when m is 2, two $L_a$ can be the same or different; when n is 2, two $L_b$ can be the same or different;

wherein the ligand $L_a$ has, at each occurrence identically or differently, a structure represented by Formula IA, and the ligand $L_b$ has, at each occurrence identically or differently, a structure represented by Formula IB:

wherein
in Formula IA, $W_1$, $W_2$, $W_3$, and $W_4$ are each independently selected from N or $CR_w$; $X_1$, $X_2$, $X_3$, and $X_4$ are each independently selected from N, C, or $CR_x$; $V_1$, $V_2$, $V_3$, and $V_4$ are each independently selected from N or $CR_v$;
in Formula IB, $Y_1$, $Y_2$, $Y_3$, and $Y_4$ are each independently selected from N or $CR_y$; $Z_1$, $Z_2$, $Z_3$, and $Z_4$ are each independently selected from N, C, or $CR_z$; $U_1$, $U_2$, $U_3$, and $U_4$ are each independently selected from N or $CR_u$;
wherein Q is, at each occurrence identically or differently, selected from O, S, or Se;
wherein $R_w$, $R_y$, $R_u$, $R_v$, $R_x$, $R_z$, and R are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group, and combinations thereof;
wherein adjacent substituents $R_w$, $R_v$, $R_x$, and R can be optionally joined to form a ring;
wherein adjacent substituents $R_y$, $R_u$, and $R_z$ can be optionally joined to form a ring.

According to another embodiment of the present disclosure, an electroluminescent device is further disclosed, which comprises an anode, a cathode and an organic layer disposed between the anode and the cathode; wherein the organic layer comprises a metal complex having a general formula of $M(L_a)_m(L_b)_n(L_c)_q$, wherein $L_a$, $L_b$, and $L_c$ are the first ligand, the second ligand and the third ligand coordinated to the metal M, respectively; wherein $L_c$ is a monoanionic bidentate ligand, and $L_c$ is the same as or different from the $L_a$ or the $L_b$; wherein $L_a$, $L_b$, and $L_c$ can be optionally joined to form a tetradentate ligand;

wherein the metal M is selected from a metal with a relative atomic mass greater than 40;

wherein m is 1 or 2, n is 1 or 2, q is 0 or 1, and m+n+q equals an oxidation state of the metal M; when m is 2, two $L_a$ can be the same or different; when n is 2, two $L_b$ can be the same or different;

wherein the ligand $L_a$ has, at each occurrence identically or differently, a structure represented by Formula IA, and the ligand $L_b$ has, at each occurrence identically or differently, a structure represented by Formula IB:

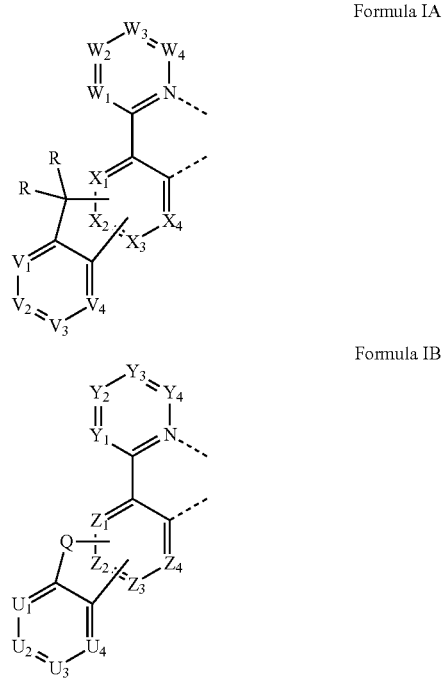

Formula IA

Formula IB wherein in Formula IA, $W_1$, $W_2$, $W_3$, and $W_4$ are each independently selected from N or $CR_w$; $X_1$, $X_2$, $X_3$, and $X_4$ are each independently selected from N, C, or $CR_x$; $V_1$, $V_2$, $V_3$, and $V_4$ are each independently selected from N or $CR_v$;

in Formula IB, $Y_1$, $Y_2$, $Y_3$, and $Y_4$ are each independently selected from N or $CR_y$; $Z_1$, $Z_2$, $Z_3$, and $Z_4$ are each independently selected from N, C, or $CR_z$; $U_1$, $U_2$, $U_3$, and $U_4$ are each independently selected from N or $CR_u$;

wherein Q is, at each occurrence identically or differently, selected from O, S, or Se;

wherein $R_w$, $R_y$, $R_u$, $R_v$, $R_x$, $R_z$, and R are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group, and combinations thereof;

wherein adjacent substituents $R_w$, $R_v$, $R_x$, and R can be optionally joined to form a ring; wherein adjacent substituents $R_y$, $R_u$, and $R_z$ can be optionally joined to form a ring.

According to another embodiment of the present disclosure, a compound formulation is further provided. The compound formulation comprises the metal complex whose specific structure is as shown in any one of the embodiments described above.

The novel metal complexes comprising a ligand having a fluorene structure and a ligand having a dibenzofuran, dibenzothiophene or dibenzoselenophene structure, as disclosed by the present disclosure, can be used as the emissive material in the electroluminescent device.

These novel compounds can greatly improve the device efficiency and provide better device performance.

DETAILED DESCRIPTION

Figure 1:
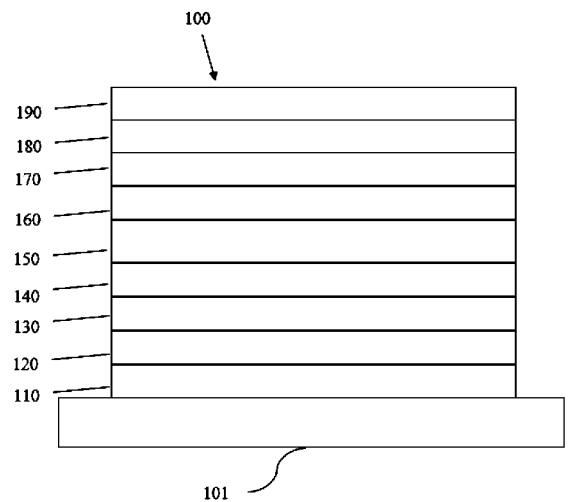
FIG. 1 is a schematic diagram of an organic light-emitting apparatus that may include a metal complex and a compound formulation disclosed by the present disclosure.

OLEDs can be fabricated on various types of substrates such as glass, plastic, and metal foil. FIG. 1 schematically shows an organic light emitting device 100 without limitation. The figures are not necessarily drawn to scale. Some of the layers in the figures can also be omitted as needed. Device 100 may include a substrate 101, an anode 110, a hole injection layer 120, a hole transport layer 130, an electron blocking layer 140, an emissive layer 150, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, the contents of which are incorporated by reference herein in its entirety.

More examples for each of these layers are available. For example, a flexible and transparent substrate-anode combination is disclosed in U.S. Pat. No. 5,844,363, which is incorporated by reference herein in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference herein in its entirety. Examples of host materials are disclosed in U.S. Pat. No. 6,303,238 to Thompson et al., which is incorporated by reference herein in its entirety. An example of an n-doped electron transport layer is BPhen doped with Li at a molar ratio of 1:1, as disclosed in U.S. Patent Application Publication No. 2003/0230980, which is incorporated by reference herein in its entirety. U.S. Pat. Nos. 5,703,436 and 5,707,745, which are incorporated by reference herein in their entireties, disclose examples of cathodes including composite cathodes having a thin layer of metal such as Mg:Ag with an overlying transparent, electrically-conductive, sputter-deposited ITO layer. The theory and use of blocking layers are described in more detail in U.S. Pat. No. 6,097,147 and U.S. Patent Application Publication No. 2003/0230980, which are incorporated by reference herein in their entireties. Examples of injection layers are provided in U.S. Patent Application Publication No. 2004/0174116, which is incorporated by reference herein in its entirety. A description of protective layers may be found in U.S. Patent Application Publication No. 2004/0174116, which is incorporated by reference herein in its entirety.

The layered structure described above is provided by way of non-limiting examples. Functional OLEDs may be achieved by combining the various layers described in different ways, or layers may be omitted entirely. It may also include other layers not specifically described. Within each layer, a single material or a mixture of multiple materials can be used to achieve optimum performance. Any functional layer may include several sublayers. For example, the emissive layer may have two layers of different emitting materials to achieve desired emission spectrum.

In one embodiment, an OLED may be described as having an "organic layer" disposed between a cathode and an anode. This organic layer may comprise a single layer or multiple layers.

Figure 2:
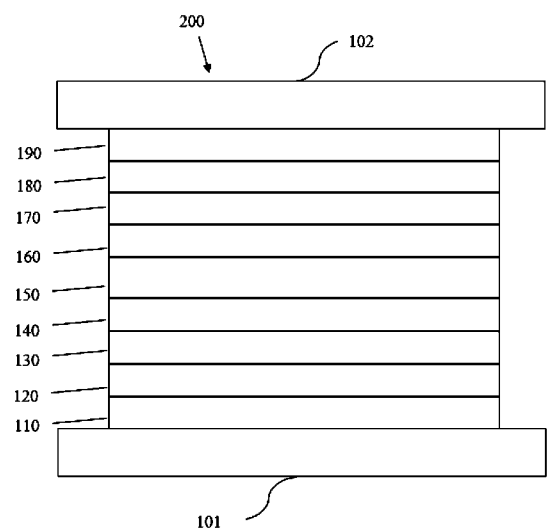
FIG. 2 is a schematic diagram of another organic light-emitting apparatus that may include a metal complex and a compound formulation disclosed by the present disclosure.

An OLED can be encapsulated by a barrier layer. FIG. 2 schematically shows an organic light emitting device 200 without limitation. FIG. 2 differs from FIG. 1 in that the organic light emitting device include a barrier layer 102, which is above the cathode 190, to protect it from harmful species from the environment such as moisture and oxygen. Any material that can provide the barrier function can be used as the barrier layer such as glass or organic-inorganic hybrid layers. The barrier layer should be placed directly or indirectly outside of the OLED device. Multilayer thin film encapsulation was described in U.S. Pat. No. 7,968,146, which is incorporated by reference herein in its entirety.

Devices fabricated in accordance with embodiments of the present disclosure can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Where a first layer is described as "disposed over" a second layer, the first layer is disposed further away from the substrate. There may be other layers between the first and second layers, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing rate is fast enough to minimize the non-radiative decay from the triplet state, the fraction of back populated singlet excited states can potentially reach 75%. The total singlet fraction can be 100%, far exceeding 25% of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta E_{S-T}$). Organic, non-metal containing, donor-acceptor luminescent materials may be able to achieve this. The emission in these materials is generally characterized as a donor-acceptor charge-transfer (CT) type emission. The spatial separation of the HOMO and LUMO in these donor-acceptor type compounds generally results in small $\Delta E_{S-T}$. These states may involve CT states. Generally, donor-acceptor luminescent materials are constructed by connecting an electron donor moiety such as amino- or carbazole-derivatives and an electron acceptor moiety such as N-containing six-membered aromatic rings.

Definition of Terms of Substituents

Halogen or halide—as used herein includes fluorine, chlorine, bromine, and iodine.

Alkyl—contemplates both straight and branched chain alkyl groups. Examples of the alkyl group include methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, 1-methylpentyl group, 2-methylpentyl group, 1-pentylhexyl group, 1-butylpentyl group, 1-heptyloctyl group, and 3-methylpentyl group.

Additionally, the alkyl group may be optionally substituted. The carbons in the alkyl chain can be replaced by other hetero atoms. Of the above, preferred are methyl group, ethyl group, propyl group, isopropyl group, n-butyl group, s-butyl group, isobutyl group, t-butyl group, n-pentyl group, and neopentyl group.

Cycloalkyl—as used herein contemplates cyclic alkyl groups. Preferred cycloalkyl groups are those containing 4 to 10 ring carbon atoms and includes cyclobutyl, cyclopentyl, cyclohexyl, 4-methylcyclohexyl, 4,4-dimethylcylcohexyl, 1-adamantyl, 2-adamantyl, 1-norbornyl, 2-norbornyl and the like. Additionally, the cycloalkyl group may be optionally substituted. The carbons in the ring can be replaced by other hetero atoms.

Alkenyl—as used herein contemplates both straight and branched chain alkene groups. Preferred alkenyl groups are those containing 2 to 15 carbon atoms. Examples of the alkenyl group include vinyl group, allyl group, 1-butenyl group, 2-butenyl group, 3-butenyl group, 1,3-butandienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl1-butenyl group, and 3-phenyl-1-butenyl group. Additionally, the alkenyl group may be optionally substituted.

Alkynyl—as used herein contemplates both straight and branched chain alkyne groups. Preferred alkynyl groups are those containing 2 to 15 carbon atoms. Additionally, the alkynyl group may be optionally substituted.

Aryl or aromatic group—as used herein includes noncondensed and condensed systems. Preferred aryl groups are those containing six to sixty carbon atoms, preferably six to twenty carbon atoms, more preferably six to twelve carbon atoms. Examples of the aryl group include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Additionally, the aryl group may be optionally substituted. Examples of the non-condensed aryl group include phenyl group, biphenyl-2-yl group, biphenyl-3-yl group, biphenyl-4-yl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 4'-methylbiphenylyl group, 4"-t-butyl p-terphenyl-4-yl group, o-cumenyl group, m-cumenyl group, p-cumenyl group, 2,3-xylyl group, 3,4-xylyl group, 2,5-xylyl group, mesityl group, and m-quarterphenyl group.

Heterocyclic group or heterocycle—as used herein includes aromatic and non-aromatic cyclic groups. Heteroaromatic also means heteroaryl. Preferred non-aromatic heterocyclic groups are those containing 3 to 7 ring atoms which include at least one hetero atom such as nitrogen, oxygen, and sulfur. The heterocyclic group can also be an aromatic heterocyclic group having at least one heteroatom selected from nitrogen atom, oxygen atom, sulfur atom, and selenium atom.

Heteroaryl—as used herein includes noncondensed and condensed hetero-aromatic groups that may include from one to five heteroatoms. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—it is represented by —O-Alkyl. Examples and preferred examples thereof are the same as those described above. Examples of the alkoxy group having 1 to 20 carbon atoms, preferably 1 to 6 carbon atoms include methoxy group, ethoxy group, propoxy group, butoxy group, pentyloxy group, and hexyloxy group. The alkoxy group having 3 or more carbon atoms may be linear, cyclic or branched.

Aryloxy—it is represented by —O-Aryl or —O-heteroaryl. Examples and preferred examples thereof are the same as those described above. Examples of the aryloxy group having 6 to 40 carbon atoms include phenoxy group and biphenyloxy group.

Arylalkyl—as used herein contemplates an alkyl group that has an aryl substituent. Additionally, the arylalkyl group may be optionally substituted. Examples of the arylalkyl group include benzyl group, 1-phenylethyl group, 2-phenylethyl group, 1-phenylisopropyl group, 2-phenylisopropyl group, phenyl-t-butyl group, alpha.-naphthylmethyl group, 1-alpha.-naphthylethyl group, 2-alpha-naphthylethyl group, 1-alpha-naphthylisopropyl group, 2-alpha-naphthylisopropyl group, beta-naphthylmethyl group, 1-beta-naphthylethyl group, 2-beta-naphthylethyl group, 1-beta-naphthylisopropyl group, 2-beta-naphthylisopropyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, and 1-chloro-2-phenylisopropyl group. Of the above, preferred are benzyl group, p-cyanobenzyl group, m-cyanobenzyl group, o-cyanobenzyl group, 1-phenylethyl group, 2-phenylethyl group, 1-phenylisopropyl group, and 2-phenylisopropyl group.

The term "aza" in azadibenzofuran, aza-dibenzothiophene, etc. means that one or more of the C—H groups in the respective aromatic fragment are replaced by a nitrogen atom. For example, azatriphenylene encompasses dibenzo[f,h]quinoxaline, dibenzo[f,h]quinoline and other analogues with two or more nitrogens in the ring system. One of ordinary skill in the art can readily envision other nitrogen analogs of the aza-derivatives described above, and all such analogs are intended to be encompassed by the terms as set forth herein.

In the present disclosure, unless otherwise defined, when any term of the group consisting of substituted alkyl, substituted cycloalkyl, substituted heteroalkyl, substituted arylalkyl, substituted alkoxy, substituted aryloxy, substituted alkenyl, substituted aryl, substituted heteroaryl, substituted alkylsilyl, substituted arylsilyl, substituted amine, substituted acyl, substituted carbonyl, substituted carboxylic acid group, substituted ester group, substituted sulfinyl, substituted sulfonyl and substituted phosphino is used, it means that any group of alkyl, cycloalkyl, heteroalkyl, arylalkyl, alkoxy, aryloxy, alkenyl, aryl, heteroaryl, alkylsilyl, arylsilyl, amine, acyl, carbonyl, carboxylic acid group, ester group, sulfinyl, sulfonyl and phosphino may be substituted with one or more groups selected from the group consisting of deuterium, a halogen, an unsubstituted alkyl group having 1 to 20 carbon atoms, an unsubstituted cycloalkyl group having 3 to 20 ring carbon atoms, an unsubstituted heteroalkyl group having 1 to 20 carbon atoms, an unsubstituted arylalkyl group having 7 to 30 carbon atoms, an unsubstituted alkoxy group having 1 to 20 carbon atoms, an unsubstituted aryloxy group having 6 to 30 carbon atoms, an unsubstituted alkenyl group having 2 to 20 carbon atoms, an unsubstituted aryl group having 6 to 30 carbon atoms, an unsubstituted heteroaryl group having 3 to 30 carbon atoms, an unsubstituted alkylsilyl group having 3 to 20 carbon atoms, an unsubstituted arylsilyl group having 6 to 20 carbon atoms, an unsubstituted amino group having 0 to 20 carbon atoms, an acyl group, a carbonyl group, a carboxylic acid group, an ester group, a cyano group, an isocyano group, a sulfanyl group, a sulfinyl group, a sulfonyl group and a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In the compounds mentioned in the present disclosure, the hydrogen atoms can be partially or fully replaced by deuterium. Other atoms such as carbon and nitrogen can also be replaced by their other stable isotopes. The replacement by other stable isotopes in the compounds may be preferred due to its enhancements of device efficiency and stability.

In the compounds mentioned in the present disclosure, multiple substitutions refer to a range that includes a double substitution, up to the maximum available substitutions. When a substitution in the compounds mentioned in the present disclosure represents multiple substitutions (including di, tri, tetra substitutions etc.), that means the substituent may exist at a plurality of available substitution positions on its linking structure, the substituents present at a plurality of available substitution positions may be the same structure or different structures.

In the compounds mentioned in the present disclosure, adjacent substituents in the compounds cannot connect to form a ring unless otherwise explicitly defined, for example, adjacent substituents can be optionally joined to form a ring. In the compounds mentioned in the present disclosure, adjacent substituents can be optionally joined to form a ring, including both the case where adjacent substituents can be joined to form a ring, and the case where adjacent substituents are not joined to form a ring. When adjacent substituents can be optionally joined to form a ring, the ring formed may be monocyclic or polycyclic, as well as alicyclic, heteroalicyclic, aromatic or heteroaromatic. In such expression, adjacent substituents may refer to substituents bonded to the same atom, substituents bonded to carbon atoms which are directly bonded to each other, or substituents bonded to carbon atoms which are more distant from each other. Preferably, adjacent substituents refer to substituents bonded to the same carbon atom and substituents bonded to carbon atoms which are directly bonded to each other.

The expression that adjacent substituents can be optionally joined to form a ring is also intended to mean that two substituents bonded to the same carbon atom are joined to each other via a chemical bond to form a ring, which can be exemplified by the following formula:

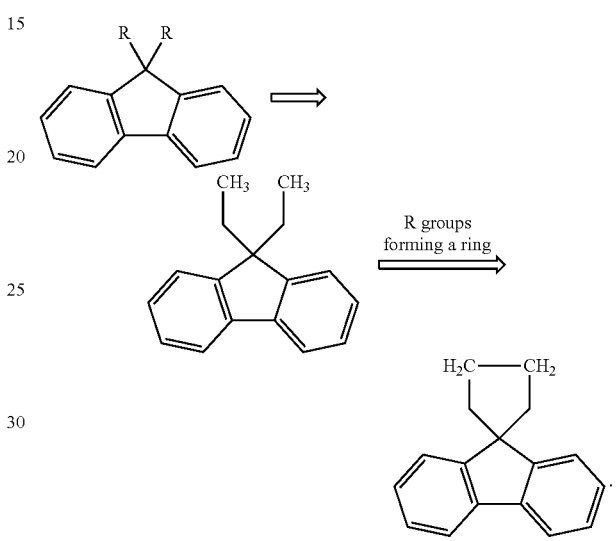

The expression that adjacent substituents can be optionally joined to form a ring is also intended to mean that two substituents bonded to carbon atoms which are directly bonded to each other are joined to each other via a chemical bond to form a ring, which can be exemplified by the following formula:

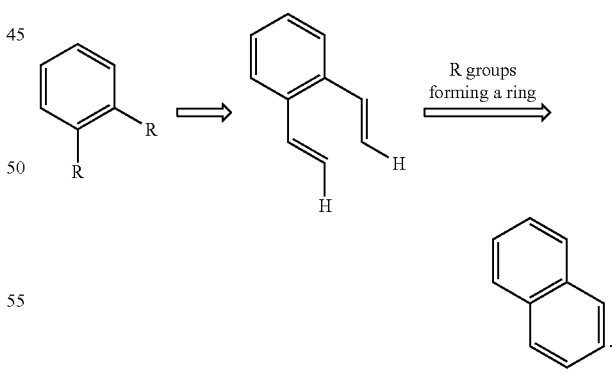

Furthermore, the expression that adjacent substituents can be optionally joined to form a ring is also intended to mean that, in the case where one of the two substituents bonded to carbon atoms which are directly bonded to each other represents hydrogen, the second substituent is bonded at a position at which the hydrogen atom is bonded, thereby forming a ring. This is exemplified by the following formula:

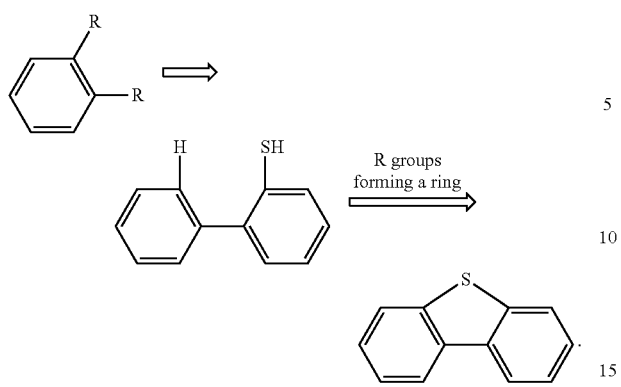

According to an embodiment of the present disclosure, a metal complex is disclosed, which has a general formula of $M(L_a)_m(L_b)_n(L_c)_q$, wherein $L_a$, $L_b$, and $L_c$ are the first ligand, the second ligand and the third ligand coordinated to the metal M, respectively; wherein $L_c$ is a monoanionic bidentate ligand, and $L_c$ is the same as or different from the $L_a$ or the $L_b$; wherein $L_a$, $L_b$, and $L_c$ can be optionally joined to form a tetradentate ligand;

wherein the metal M is selected from a metal with a relative atomic mass greater than 40;

wherein m is 1 or 2, n is 1 or 2, q is 0 or 1, and m+n+q equals an oxidation state of the metal M; when m is 2, two $L_a$ can be the same or different; when n is 2, two $L_b$ can be the same or different;

wherein the ligand $L_a$ has, at each occurrence identically or differently, a structure represented by Formula IA, and the ligand $L_b$ has, at each occurrence identically or differently, a structure represented by Formula IB:

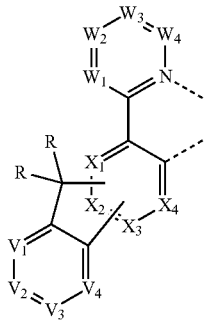

Formula IA

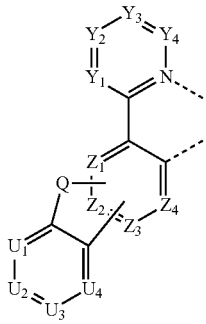

Formula IB wherein in Formula IA, $W_1$, $W_2$, $W_3$, and $W_4$ are each independently selected from N or $CR_w$; $X_1$, $X_2$, $X_3$, and $X_4$ are each independently selected from N, C, or $CR_x$; $V_1$, $V_2$, $V_3$, and $V_4$ are each independently selected from N or $CR_v$;

in Formula IB, $Y_1$, $Y_2$, $Y_3$, and $Y_4$ are each independently selected from N or $CR_y$; $Z_1$, $Z_2$, $Z_3$, and $Z_4$ are each independently selected from N, C, or $CR_z$; $U_1$, $U_2$, $U_3$, and $U_4$ are each independently selected from N or $CR_u$;

wherein Q is, at each occurrence identically or differently, selected from O, S, or Se;

wherein $R_w$, $R_y$, $R_u$, $R_v$, $R_x$, $R_z$, and R are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group, and combinations thereof;

wherein adjacent substituents $R_w$, $R_v$, $R_x$, and R can be optionally joined to form a ring;

wherein adjacent substituents $R_y$, $R_u$, and $R_z$ can be optionally joined to form a ring.

In the present disclosure, the expression that adjacent substituents $R_w$, $R_v$, $R_x$, and R can be optionally joined to form a ring is intended to mean that in Formula IA, one or more of the groups of adjacent substituents, such as two substituents $R_w$, two substituents $R_v$, two substituents $R_x$, two substituents R, substituents $R_w$ and R, substituents $R_v$ and R, substituents $R_v$ and $R_x$, substituents $R_w$ and $R_x$, and substituents $R_w$ and $R_v$, may be optionally joined to form a ring. Obviously, any of these groups of substituents may not be joined to form a ring.

In the present disclosure, the expression that adjacent substituents $R_y$, $R_u$, and $R_z$ can be optionally joined to form a ring is intended to mean that in Formula IB, one or more of the groups of adjacent substituents, such as two substituents $R_y$, two substituents $R_u$, two substituents $R_z$, substituents $R_y$ and $R_u$, substituents $R_y$ and $R_z$, and substituents $R_u$ and $R_z$, may be optionally joined to form a ring. Obviously, any of these groups of substituents may not be joined to form a ring.

In the present disclosure, the expression that $L_a$, $L_b$, and $L_c$ can be optionally joined to form a tetradentate ligand is intended to mean that any two of ligands $L_a$, $L_b$, and $L_c$, such as $L_a$ and $L_b$, $L_a$ and $L_c$, and $L_b$ and $L_c$, may be joined to form a tetradentate ligand. Obviously, in the present application, the case where three ligands, $L_a$, $L_b$, and $L_c$, are joined to form a hexadentate ligand is excluded. Obviously, it can be understood that the three ligands, $L_a$, $L_b$, and $L_c$, may not be joined to each other.

According to an embodiment of the present disclosure, wherein, the metal M is selected from the group consisting of Cu, Ag, Au, Ru, Rh, Pd, Os, Ir, and Pt.

According to an embodiment of the present disclosure, wherein, the metal M is selected from Pt, Os, or Ir.

According to an embodiment of the present disclosure, wherein, the metal M is selected from Ir.

According to an embodiment of the present disclosure, wherein the $L_a$ is, at each occurrence identically or differently, selected from the group consisting of:

Formula II

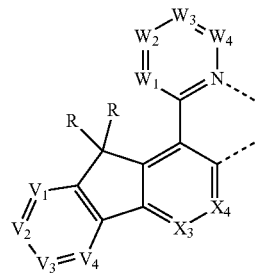

Formula III

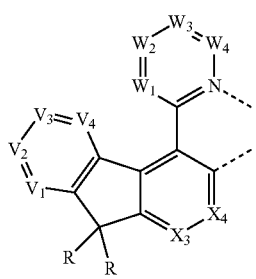

Formula IV

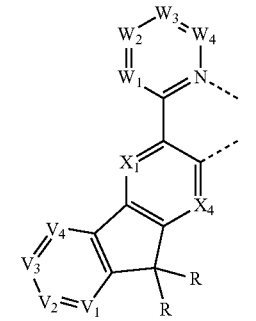

Formula V

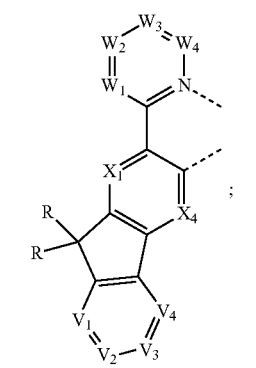

wherein, $X_1$, $X_3$, and $X_4$ are each independently selected from N or $CR_x$; $W_1$, $W_2$, $W_3$, and $W_4$ are each independently selected from N or $CR_w$; $V_1$, $V_2$, $V_3$, and $V_4$ are each independently selected from N or $CR_v$;

wherein $L_b$ is, at each occurrence identically or differently, selected from the group consisting of:

Formula VI

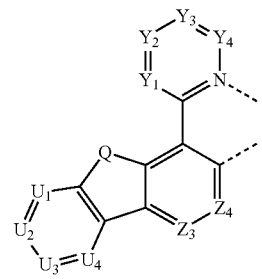

Formula VII

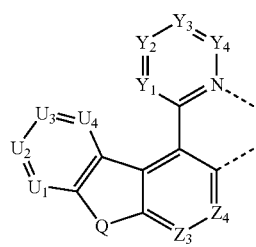

Formula VIII

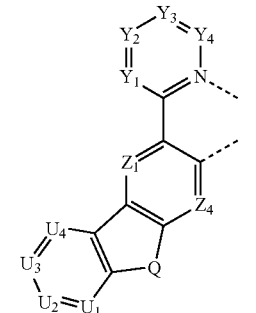

Formula IX

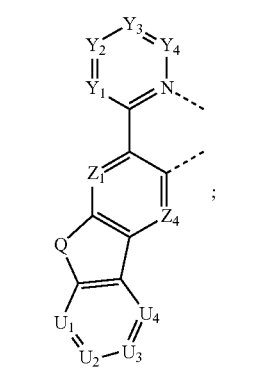

wherein, $Z_1$, $Z_3$, and $Z_4$ are each independently selected from N or $CR_z$; $U_1$, $U_2$, $U_3$, and $U_4$ are each independently selected from N or $CR_u$; $Y_1$, $Y_2$, $Y_3$, and $Y_4$ are each independently selected from N or $CR_y$; Q is, at each occurrence identically or differently, selected from O, S, or Se;

wherein $R_w$, $R_y$, $R_u$, $R_v$, $R_x$, $R_z$, and R are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group, and combinations thereof;
wherein adjacent substituents $R_w$, $R_v$, $R_x$, and R can be optionally joined to form a ring;
wherein adjacent substituents $R_y$, $R_u$, and $R_z$ can be optionally joined to form a ring.

According to an embodiment of the present disclosure, wherein, $L_a$ is, at each occurrence identically or differently, selected from a structure represented by Formula II, Formula III, or Formula IV.

According to an embodiment of the present disclosure, wherein, $L_a$ is, at each occurrence identically or differently, selected from a structure represented by Formula IV.

According to an embodiment of the present disclosure, wherein, $L_b$ is, at each occurrence identically or differently, selected from a structure represented by Formula VI.

According to an embodiment of the present disclosure, wherein, in Formula II to Formula V, at least one of $W_1$, $W_2$, $W_3$, $W_4$, $X_1$, $X_3$, $X_4$, $V_1$, $V_2$, $V_3$, and $V_4$ is selected from N.

According to an embodiment of the present disclosure, wherein, in Formula VI to Formula IX, at least one of $Y_1$, $Y_2$, $Y_3$, $Y_4$, $Z_1$, $Z_3$, $Z_4$, $U_1$, $U_2$, $U_3$, and $U_4$ is selected from N.

According to an embodiment of the present disclosure, wherein, in Formula II to Formula V, one of $W_1$, $W_2$, $W_3$, $W_4$, $X_1$, $X_3$, $X_4$, $V_1$, $V_2$, $V_3$, and $V_4$ is selected from N.

According to an embodiment of the present disclosure, wherein, in Formula VI to Formula IX, one of $Y_1$, $Y_2$, $Y_3$, $Y_4$, $Z_1$, $Z_3$, $Z_4$, $U_1$, $U_2$, $U_3$, and $U_4$ is selected from N.

According to an embodiment of the present disclosure, wherein, in Formula II to Formula V, one of $X_1$, $X_3$, $X_4$, $V_1$, $V_2$, $V_3$, and $V_4$ is selected from N.

According to an embodiment of the present disclosure, wherein, in Formula VI to Formula IX, one of $Z_1$, $Z_3$, $Z_4$, $U_1$, $U_2$, $U_3$, and $U_4$ is selected from N.

According to an embodiment of the present disclosure, wherein, in Formula II to Formula V, one of $V_1$, $V_2$, $V_3$, and $V_4$ is selected from N.

According to an embodiment of the present disclosure, wherein, in Formula VI to Formula IX, one of $U_1$, $U_2$, $U_3$, and $U_4$ is selected from N.

According to an embodiment of the present disclosure, wherein, in Formula II to Formula V, $W_1$, $W_2$, $W_3$, and $W_4$ are each independently selected from $CR_w$; $X_1$, $X_3$, and $X_4$ are each independently selected from $CR_x$; $V_1$, $V_2$, $V_3$, and $V_4$ are each independently selected from $CR_v$;
wherein in Formula VI to Formula IX, $Y_1$, $Y_2$, $Y_3$, and $Y_4$ are each independently selected from $CR_y$; $Z_1$, $Z_3$, and $Z_4$ are each independently selected from $CR_z$; $U_1$, $U_2$, $U_3$, and $U_4$ are each independently selected from $CR_u$.

According to an embodiment of the present disclosure, wherein $R_w$ and $R_y$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted alkylsilyl having 3 to 20 carbon atoms, substituted or unsubstituted arylsilyl having 6 to 20 carbon atoms, a cyano group, an isocyano group, and combinations thereof.

According to an embodiment of the present disclosure, wherein, $R_w$ and $R_y$ are, at each occurrence identically or differently, selected from the group consisting of: hydrogen, deuterium, fluorine, methyl, ethyl, isopropyl, isobutyl, cyano, isocyano, and combinations thereof.

According to an embodiment of the present disclosure, wherein, Q is, at each occurrence identically or differently, selected from O or S.

According to an embodiment of the present disclosure, wherein, Q is O.

According to an embodiment of the present disclosure, wherein, $R_u$, $R_v$, $R_x$, $R_z$, and R are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, a cyano group, an isocyano group, a sulfanyl group, a sulfinyl group, a sulfonyl group, a phosphino group, and combinations thereof.

According to an embodiment of the present disclosure, wherein, $R_u$, $R_v$, $R_x$, $R_z$, and R are, at each occurrence identically or differently, selected from the group consisting of: hydrogen, deuterium, fluorine, methyl, ethyl, isopropyl, isobutyl, phenyl, cyano, isocyano, and combinations thereof.

According to an embodiment of the present disclosure, wherein, the ligand $L_a$ is, at each occurrence identically or differently, selected from the group consisting of $L_{a-1}$ to $L_{a-368}$, and the ligand $L_b$ is, at each occurrence identically or differently, selected from the group consisting of $L_{b-1}$ to $L_{b-560}$. For the specific structures of $L_{a-1}$ to $L_{a-368}$ and $L_{b-1}$ to $L_{b-560}$, reference is made to claim 9.

According to an embodiment of the present disclosure, wherein, $L_c$ is selected from the group consisting of the following structures:

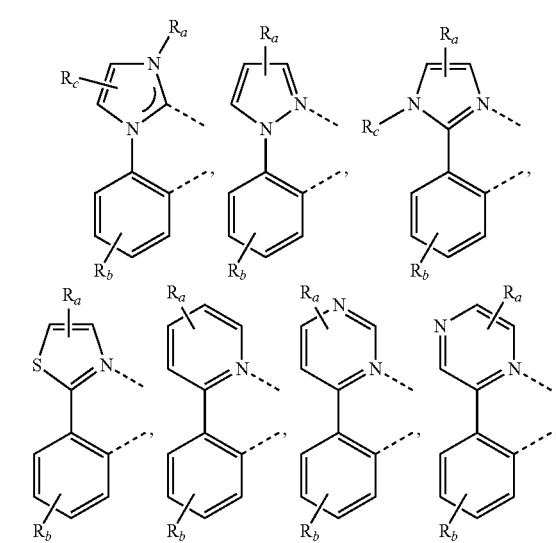

-continued

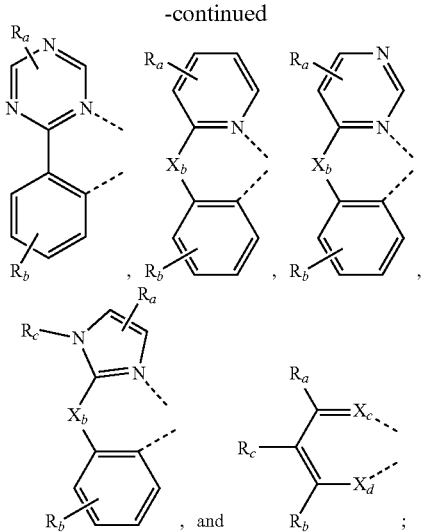

wherein $R_a$, $R_b$, and $R_c$ can represent mono-substitution, multiple substitutions, or non-substitution;

$X_b$ is, at each occurrence identically or differently, selected from the group consisting of: O, S, Se, $NR_{N1}$, and $CR_{C1}R_{C2}$;

$X_c$ and $X_d$ are, at each occurrence identically or differently, selected from the group consisting of: O, S, Se, and $NR_{N1}$;

$R_a$, $R_b$, $R_c$, $R_{N1}$, $R_{N2}$, $R_{C1}$ and $R_{C2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group, and combinations thereof; and adjacent substituents $R_a$, $R_b$, $R_c$, $R_{N1}$, $R_{N2}$, $R_{C1}$ and $R_{C2}$ can be optionally joined to form a ring.

In the present disclosure, the expression that adjacent substituents $R_a$, $R_b$, $R_c$, $R_{N1}$, $R_{N2}$, $R_{C1}$ and $R_{C2}$ can be optionally joined to form a ring is intended to mean that one or more of the groups of adjacent substituents, such as substituents $R_a$ and $R_b$, substituents $R_b$ and $R_c$, substituents $R_a$ and $R_c$, substituents $R_{C1}$ and $R_{C2}$, substituents $R_a$ and $R_{N1}$, substituents Re and $R_{N1}$, substituents $R_c$ and $R_{N1}$, substituents $R_a$ and $R_{N2}$, substituents $R_b$ and $R_{N2}$, substituents $R_c$ and $R_{C1}$, substituents $R_b$ and $R_{C1}$, substituents $R_c$ and $R_{C1}$, substituents $R_c$ and $R_{C2}$, substituents $R_b$ and $R_{C2}$, substituents $R_a$ and $R_{C2}$, substituents Re and $R_{C2}$, two substituents $R_a$, two substituents $R_b$, and two substituents $R_c$, may be joined to form a ring. Obviously, for those skilled in the art, any of these groups of substituents may not be joined to form a ring.

According to an embodiment of the present disclosure, wherein, the ligand $L_c$ is selected from the group consisting of $L_{c-1}$ to $L_{c-59}$, wherein for the specific structures of $L_{c-1}$ to $L_{c-59}$, reference is made to claim 10.

According to an embodiment of the present disclosure, wherein, the metal complex is selected from the group consisting of Compound 1 to Compound 939, wherein for the specific structures of Compound 1 to Compound 939, reference is made to claim 11.

According to an embodiment of the present disclosure, an electroluminescent device is further disclosed, which includes:

an anode,
a cathode, and
an organic layer disposed between the anode and the cathode, wherein the organic layer comprises a metal complex having a general formula of $M(L_a)_m(L_b)_n(L_c)_q$, wherein $L_a$, $L_b$, and $L_c$ are the first ligand, the second ligand and the third ligand coordinated to the metal M, respectively, wherein $L_e$ is a monoanionic bidentate ligand, and $L_e$ is the same as or different from $L_a$ or $L_b$; wherein $L_a$, $L_b$, and $L_c$ can be optionally joined to form a tetradentate ligand;

wherein the metal M is selected from a metal with a relative atomic mass greater than 40;

wherein m is 1 or 2, n is 1 or 2, q is 0 or 1, and m+n+q equals to the oxidation state of the metal M; when m is 2, two $L_a$ can be the same or different; when n is 2, two $L_b$ can be the same or different;

wherein the ligand $L_a$ has, at each occurrence identically or differently, a structure represented by Formula IA, and the ligand $L_b$ has, at each occurrence identically or differently, a structure represented by Formula IB:

Formula IA

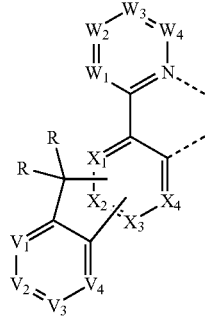

Formula IB

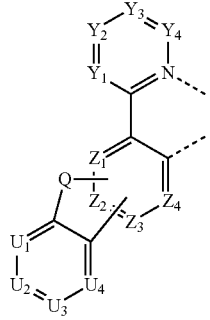

wherein
in Formula IA, $W_1$, $W_2$, $W_3$, and $W_4$ are each independently selected from N or $CR_w$; $X_1$, $X_2$, $X_3$, and $X_4$ are each independently selected from N, C, or $CR_x$; $V_1$, $V_2$, $V_3$, and $V_4$ are each independently selected from N or $CR_v$;

in Formula IB, $Y_1$, $Y_2$, $Y_3$, and $Y_4$ are each independently selected from N or $CR_y$; $Z_1$, $Z_2$, $Z_3$, and $Z_4$ are each independently selected from N, C, or $CR_z$; $U_1$, $U_2$, $U_3$, and $U_4$ are each independently selected from N or $CR_u$;

wherein Q is, at each occurrence identically or differently, selected from O, S, or Se;

wherein $R_w$, $R_y$, $R_u$, $R_v$, $R_x$, $R_z$, and R are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group, and combinations thereof;

wherein adjacent substituents $R_w$, $R_v$, $R_x$, and R can be optionally joined to form a ring;

wherein adjacent substituents $R_y$, $R_u$, and $R_z$ can be optionally joined to form a ring.

According to an embodiment of the present disclosure, in the device, wherein the organic layer is an emissive layer, and the compound is an emissive material.

According to an embodiment of the present disclosure, in the device, wherein the organic layer further comprises a host material.

According to an embodiment of the present disclosure, in the device, wherein the organic layer further comprises at least two host materials.

According to an embodiment of the present disclosure, in the device, wherein the host material comprises at least one chemical group selected from the group consisting of: benzene, biphenyl, pyridine, pyrimidine, triazine, carbazole, azacarbazole, indolocarbazole, dibenzothiophene, azadibenzothiophene, dibenzofuran, azadibenzofuran, dibenzoselenophene, azadibenzoselenophene, triphenylene, azatriphenylene, fluorene, silafluorene, naphthalene, quinoline, isoquinoline, quinazoline, quinoxaline, phenanthrene, azaphenanthrene, and combinations thereof.

According to an embodiment of the present disclosure, wherein the electroluminescent device is incorporated into a device in the group consisting of: consumer products, electronic element modules, organic light-emitting devices, and lighting panels.

According to another embodiment of the present disclosure, a compound formulation is further disclosed, which comprises a metal complex. The specific structure of the metal complex is shown in any one of the embodiments described above.

Combination with Other Materials

The materials described in the present disclosure for a particular layer in an organic light emitting device can be used in combination with various other materials present in the device. The combinations of these materials are described in more detail in U.S. Pat. App. No. 20160359122 at paragraphs 0132-0161, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light emitting device may be used in combination with a variety of other materials present in the device. For example, emissive dopants disclosed herein may be used in combination with a wide variety of hosts, transport layers, blocking layers, injection layers, electrodes and other layers that may be present. The combination of these materials is described in detail in paragraphs 0080-0101 of U.S. Pat. App. No. 20150349273, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

In the embodiments of material synthesis, all reactions were performed under nitrogen protection unless otherwise stated. All reaction solvents were anhydrous and used as received from commercial sources. Synthetic products were structurally confirmed and tested for properties using one or more conventional equipment in the art (including, but not limited to, nuclear magnetic resonance instrument produced by BRUKER, liquid chromatograph produced by SHIMADZU, liquid chromatograph-mass spectrometry produced by SHIMADZU, gas chromatograph-mass spectrometry produced by SHIMADZU, differential Scanning calorimeters produced by SHIMADZU, fluorescence spectrophotometer produced by SHANGHAI LENGGUANG TECH., electrochemical workstation produced by WUHAN CORRTEST, and sublimation apparatus produced by ANHUI BEQ, etc.) by methods well known to the persons skilled in the art. In the embodiments of the device, the characteristics of the device were also tested using conventional equipment in the art (including, but not limited to, evaporator produced by ANGSTROM ENGINEERING, optical testing system produced by SUZHOU FATAR, life testing system produced by SUZHOU FATAR, and ellipsometer produced by BEIJING ELLITOP, etc.) by methods well known to the persons skilled in the art. As the persons skilled in the art are aware of the above-mentioned equipment use, test methods and other related contents, the inherent data of the sample can be obtained with certainty and without influence, so the above related contents are not further described in this present disclosure.

Material Synthesis Example

The method for preparing a compound in the present disclosure is not limited herein. Typically, the following compounds are used as examples without limitations, and synthesis routes and preparation methods thereof are described below.

Synthesis Example 1: Synthesis of Compound 177

Step 1:

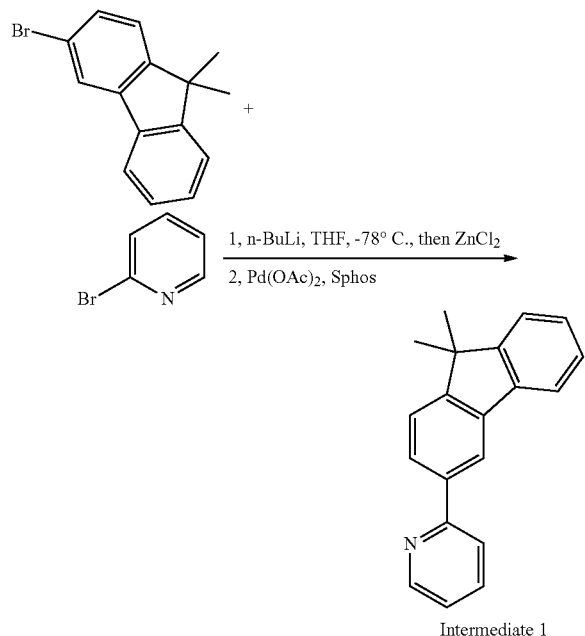

Intermediate 1

3-bromo-9,9-dimethylfluorene (27.3 g, 100 mmol) was dissolved in 200 mL of THF, and n-butyllithium (40 mL, 100 mmol) was added slowly dropwise at −78° C. After the mixture was held at −78° C. for half an hour, a solution of zinc chloride (70 mL, 70 mmol) in THF was added slowly dropwise, and then the mixture was warmed to room temperature. After the reaction continued for one hour, 2-bromopyridine (16 g, 105 mmol), palladium acetate (424 mg, 2 mmol) and SPhos (1.6 g, 4 mmol) were added sequentially. Then the obtained mixture was stirred overnight at room temperature. After TLC showed that the reaction was complete, the reaction was quenched with 200 mL of saturated aqueous ammonium chloride solution. Layers were separated. The aqueous phase was extracted three times with dichloromethane, and the organic phases were combined and washed with saturated brine. The organic phase was dried over anhydrous sodium sulphate and subjected to rotary evaporation to dryness. The residue was purified by column chromatography to give Intermediate 1 (23.2 g, 80% yield) as a colorless oil.

Step 2:

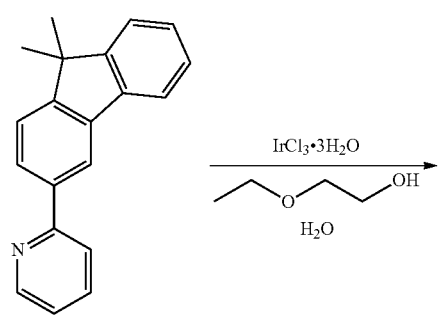

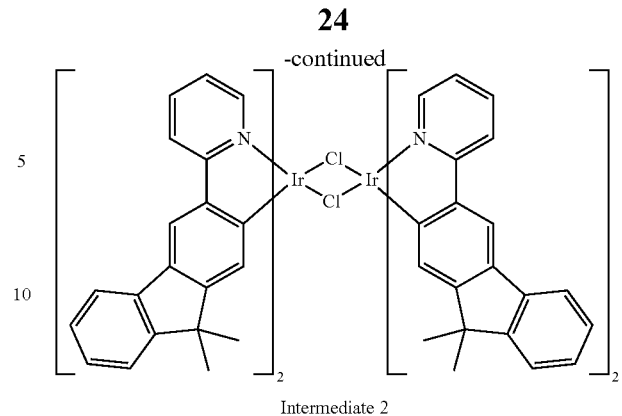

Intermediate 2

Intermediate 1 (7.4 g, 27.1 mmol) was dissolved in 200 mL of 2-ethoxyethanol and 60 mL of water, iridium trichloride trihydrate (3.4 g, 9.7 mmol) was added. Nitrogen replacement was performed three times, and then the mixture was heated to 135° C. and reacted for 24 h. After the reaction was complete and then cooled to room temperature. The resulting solid was filtered. The filtered solid was washed with a small amount of methanol and then dried to give Intermediate 2. Intermediate 2 was directly used in the next step without further purification.

Step 3:

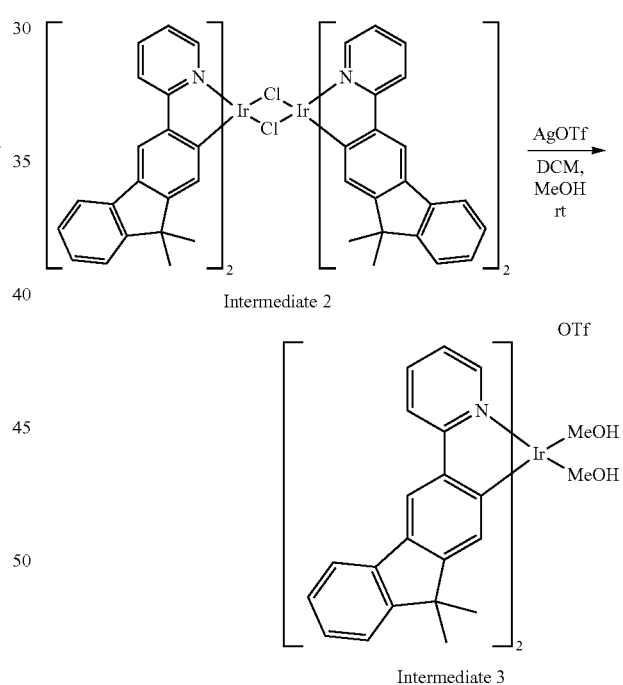

Intermediate 3

Intermediate 2 obtained in the above step was dissolved in dichloromethane (500 mL) and methanol (50 mL), and then silver trifluoromethanesulfonate (2.9 g, 11 mmol) were added. Nitrogen replacement was performed three times, and the mixture was stirred overnight at room temperature. After the reaction was completed, the mixture was filtered with Celite, and the filter cake was washed with dichloromethane. The filtrate was subjected to rotary evaporation to dryness to give Intermediate 3 (7.2 g, 85% yield) as a yellow solid. Intermediate 3 was used directly in the next step without further purification.

Step 4:

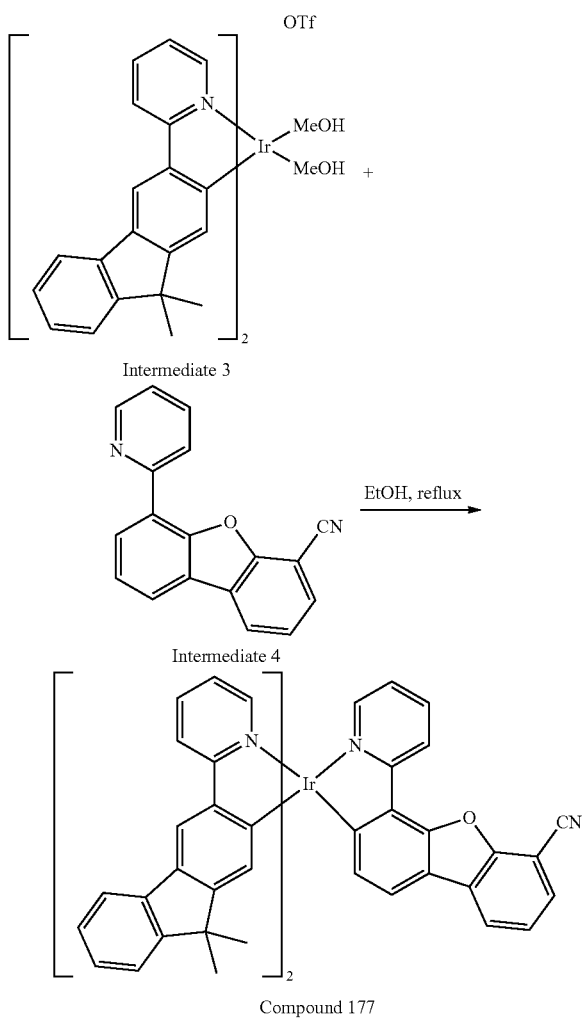

Intermediate 3 (6.7 g, 7.1 mmol) and Intermediate 4 (2.5 g, 9.2 mmol) were dissolved in 200 mL of ethanol. The resulting solution was bubbled with $N_2$ for 15 min and heated to reflux overnight under $N_2$ protection. The reaction was cooled and filtered with Celite. The filter cake was washed twice respectively with methanol and n-hexane. The yellow solid on the Celite was dissolved with dichloromethane. The organic phases were collected, concentrated under reduced pressure, and purified by column chromatography by eluting with dichloromethane and petroleum ether to give Compound 177 (600 mg, 9.1% yield) as a yellow solid. The product was confirmed as the target product with a molecular weight of 1002.

Those skilled in the art will appreciate that the above preparation method is merely illustrative. Those skilled in the art can obtain other compound structures of the present disclosure through the modifications of the preparation method.

DEVICE EXAMPLE

Device Example 1

First, a glass substrate having an Indium Tin Oxide (ITO) anode with a thickness of 80 nm was cleaned and then treated with oxygen plasma and UV ozone. After the treatment, the substrate was dried in a glovebox to remove water. Next, the substrate was mounted on a substrate holder and placed in a vacuum chamber. Organic layers specified below were sequentially deposited through vacuum thermal evaporation on the ITO anode at a rate of 0.2 to 2 Angstroms per second at a vacuum degree of about $10^{-8}$ tor. Compound HI was used as a hole injection layer (HIL) with a thickness of 100 Å. Compound HT was used as a hole transporting layer (HTL) with a thickness of 350 Å. Compound H1 was used as an electron blocking layer (EBL) with a thickness of 50 Å. Compound 177 of the present disclosure was doped in Compound H1 and Compound H2, and these compounds were used as an emissive layer (EML) with a thickness of 400 Å. Compound H2 was used as a hole blocking layer (HBL) with a thickness of 100 Å. On HBL, a mixture of Compound ET and 8-hydroxyquinolinolato-lithium (Liq) was deposited as an electron transporting layer (ETL) with a thickness of 350 Å. Finally, Liq with a thickness of 1 nm was deposited as an electron injection layer, and Al with a thickness of 120 nm was deposited as a cathode. The device was then transferred back to the glovebox and encapsulated with a glass lid and a moisture getter to complete the device.

Device Comparative Example 1

The device in Device Comparative Example 1 was prepared in the same manner as in Device Example 1, except that Compound 177 of the present disclosure in the emissive layer (EML) was replaced by Comparative Compound A.

Detailed structures and thicknesses of layers of the devices are shown in the following table. The layers using more than one material were obtained by doping different compounds at the weight ratio as recorded.

TABLE 1

| Part of device structures in device example and device comparative example |||||||
|---|---|---|---|---|---|---|
| Device No. | HIL | HTL | EBL | EML | HBL | ETL |
| Example 1 | Compound HI (100 Å) | Compound HT (350 Å) | Compound H1 (50 Å) | Compound H1: Compound H2: Compound 177 (46:46:8) (400 Å) | Compound H2 (100 Å) | Compound ET:Liq (40:60) (350 Å) |
| Comparative Example 1 | Compound HI (100 Å) | Compound HT (350 Å) | Compound H1 (50 Å) | Compound H1: Compound H2: Compound A (46:46:8) (400 Å) | Compound H2 (100 Å) | Compound ET:Liq (40:60) (350 Å) |

The structures of the materials used in the devices are shown as follows:

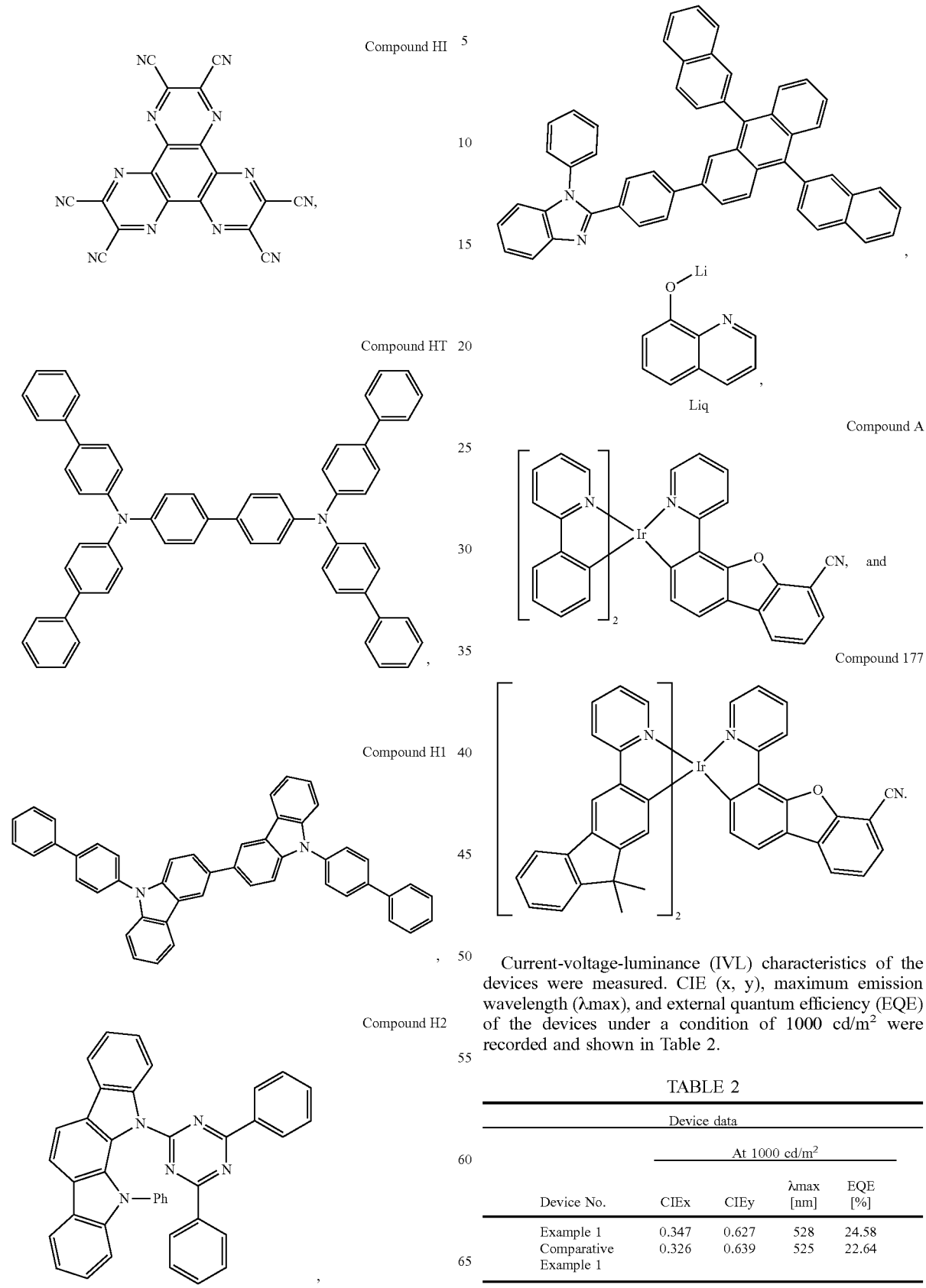

Current-voltage-luminance (IVL) characteristics of the devices were measured. CIE (x, y), maximum emission wavelength (λmax), and external quantum efficiency (EQE) of the devices under a condition of 1000 cd/m² were recorded and shown in Table 2.

TABLE 2

| | Device data | | | |
|---|---|---|---|---|
| | At 1000 cd/m² | | | |
| Device No. | CIEx | CIEy | λmax [nm] | EQE [%] |
| Example 1 | 0.347 | 0.627 | 528 | 24.58 |
| Comparative Example 1 | 0.326 | 0.639 | 525 | 22.64 |

DISCUSSION

From the results of the device tests in Table 2, it can be seen that at 1000 nits, the wavelength in Example 1 shows slight red-shift, which is advantageous for regulating efficient green-light emitting devices. In addition, the external quantum efficiency (EQE) in Example 1 is 24.58%, which is 8.6% higher relative to that in Comparative Example 1, nearly 9% higher than the efficiency which has already been high. Such improvement is extremely rare, and the present disclosure can provide green-light emitting material with very high efficiency for the industry.

It should be understood that various embodiments described herein are embodiments and not intended to limit the scope of the present disclosure. Therefore, it is apparent to those skilled in the art that the present disclosure as claimed may include variations of specific embodiments and preferred embodiments described herein. Many of the materials and structures described herein may be replaced with other materials and structures without departing from the spirit of the present disclosure. It should be understood that various theories as to why the present disclosure works are not intended to be limitative.

The invention claimed is:

1. A metal complex, having a general formula of $Ir(L_a)_m(L_b)_n$, wherein $L_a$, $L_b$ are the first ligand, and the second ligand coordinated to the metal Ir;
    wherein m is 1 or 2, n is 1 or 2, and m+n equals to the oxidation state of the metal Ir; when m is 2, two $L_a$ can be the same or different; when n is 2, two $L_b$ can be the same or different;
    wherein the ligand $L_a$ has, at each occurrence identically or differently, a structure represented by Formula IV, and the ligand $L_b$ has, at each occurrence identically or differently, a structure represented by Formula VI:

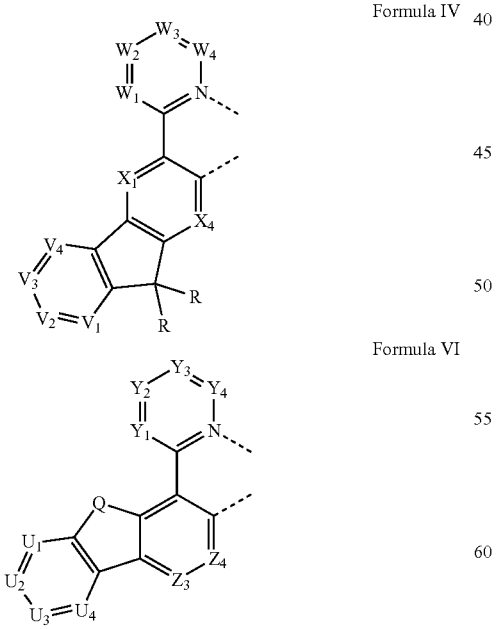

Wherein,
in Formula IV, $W_1$, $W_2$, $W_3$, and $W_4$ are each independently selected from $CR_w$;
$X_1$, and $X_4$ are each independently selected from $CR_x$, $V_1$, $V_2$, $V_3$, and $V_4$ are each independently selected from $CR_v$;
in Formula VI, $Y_1$, $Y_2$, $Y_3$, and $Y_4$ are each independently selected from $CR_y$; $Z_3$, and $Z_4$ are each independently selected from $CR_z$; $U_2$, $U_3$, and $U_4$ are each independently selected from $CR_u$;
wherein Q is, at each occurrence identically or differently, selected from O or Se;
wherein R is, at each occurrence identically or differently, selected from the group consisting of: hydrogen, substituted or unsubstituted alkyl having 1 to 20 carbon atoms, and combinations thereof;
wherein $R_w$, $R_y$, $R_u$, $R_v$, $R_x$, and $R_z$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, and combinations thereof;
wherein $U_1$ is selected from $CR_u$, and $R_u$ is a cyano group;
wherein the substituted alkyl, the substituted cycloalkyl, the substituted aryl, the substituted heteroaryl means that the alkyl, the cycloalkyl, the aryl, the heteroaryl is substituted with one or more substituents selected from the group consisting of deuterium, halogen, unsubstituted alkyl having 1 to 20 carbon atoms, unsubstituted cycloalkyl having 3 to 20 ring carbon atoms, unsubstituted aryl having 6 to 30 carbon atoms, unsubstituted heteroaryl having 3 to 30 carbon atoms, a cyano group, and combinations thereof;
wherein adjacent substituents $R_w$, $R_v$, $R_x$, is R can be optionally joined to form a ring;
wherein adjacent substituents $R_y$, $R_u$, and $R_z$ can be optionally joined to form a ring.

2. The metal complex according to claim 1,
    wherein R is selected from substituted or unsubstituted alkyl having 1 to 20 carbon atoms;
    wherein $R_w$, $R_y$, $R_u$, $R_v$, $R_x$, and $R_z$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, a cyano group, and combinations thereof;
    wherein $U_1$ is selected from $CR_u$, and $R_u$ is a cyano group;
    the substituted alkyl, the substituted cycloalkyl, means that the alkyl, the cycloalkyl, is substituted with one or more substituents selected from the group consisting of deuterium, halogen, unsubstituted alkyl having 1 to 20 carbon atoms, unsubstituted cycloalkyl having 3 to 20 ring carbon atoms, a cyano group, and combinations thereof.

3. The metal complex according to claim 1, wherein $R_w$ and $R_y$ are, at each occurrence identically or differently, selected from the group consisting of hydrogen, deuterium, halogen, substituted or unsubstituted alkyl having 1 to 20 carbon atoms, substituted or unsubstituted cycloalkyl having 3 to 20 ring carbon atoms, substituted or unsubstituted alkylsilyl having 3 to 20 carbon atoms, and combinations thereof.

4. The metal complex according to claim 1, wherein Q is O.

5. The metal complex according to claim 1, wherein:

R is, at each occurrence identically or differently, selected from the group consisting of hydrogen, substituted or unsubstituted alkyl having 1 to 6 carbon atoms, and combinations thereof; and $R_u$, $R_v$, $R_x$, and $R_z$ are, at each occurrence identically or differently, selected from the group consisting of: hydrogen, deuterium, halogen, substituted or unsubstituted alkyl having 1 to 6 carbon atoms, substituted or unsubstituted cycloalkyl having 4 to 10 ring carbon atoms, substituted or unsubstituted aryl having 6 to 12 carbon atoms, substituted or unsubstituted heteroaryl having 3 to 12 carbon atoms, a cyano group, and combinations thereof, with the proviso that the $R_u$ associated with $U_1$ is a cyano group.

6. The metal complex according to claim 1, wherein $L_a$ is, at each occurrence identically or differently, selected from the group consisting of:

$L_{a\text{-}295}$ $L_{a\text{-}296}$ $L_{a\text{-}297}$

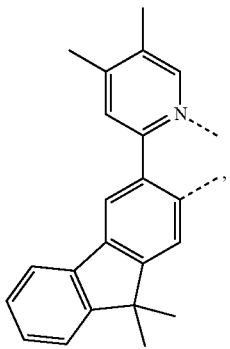

$L_{a\text{-}298}$

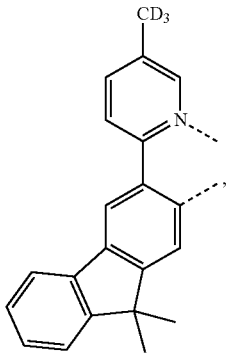

$L_{a\text{-}299}$

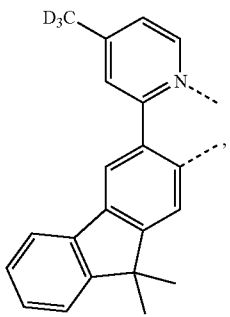

$L_{a\text{-}300}$

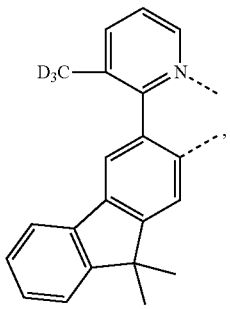

$L_{a\text{-}301}$

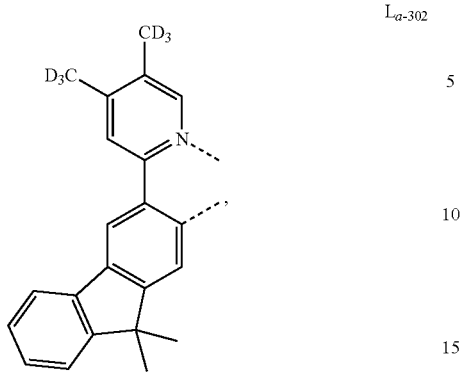 L<sub>a-302</sub>
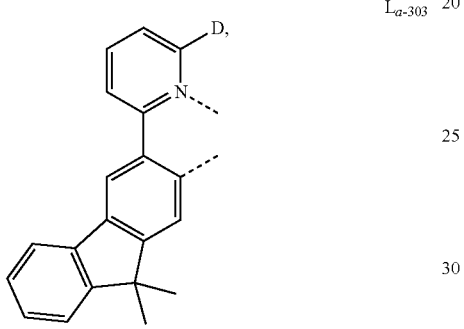 L<sub>a-303</sub>
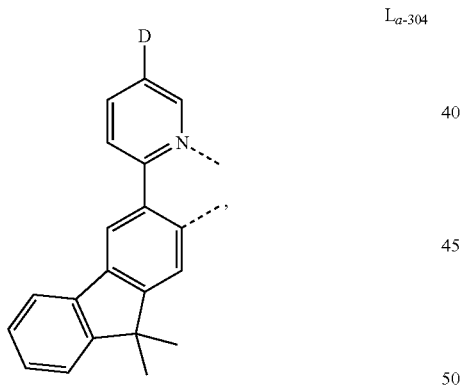 L<sub>a-304</sub>
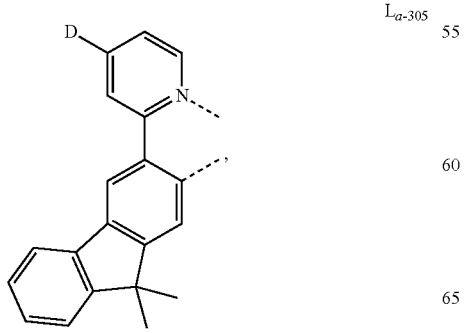 L<sub>a-305</sub>
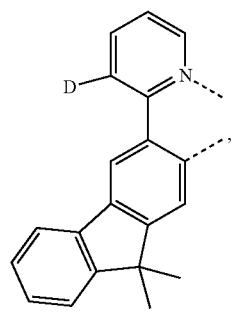 L<sub>a-306</sub>
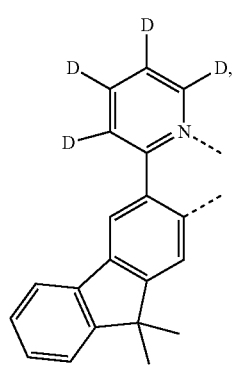 L<sub>a-307</sub>
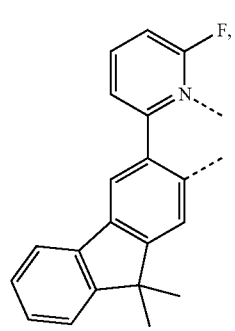 L<sub>a-308</sub>
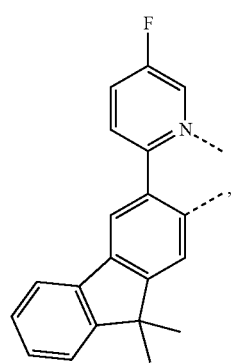 L<sub>a-309</sub>

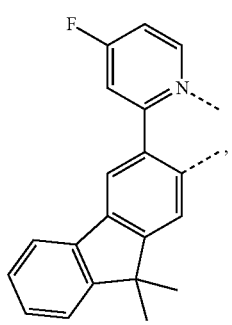
L_a-310
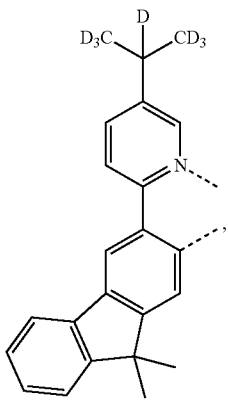
L_a-314
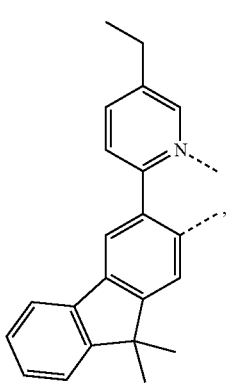
L_a-315
L_a-311
L_a-312
L_a-316
L_a-313
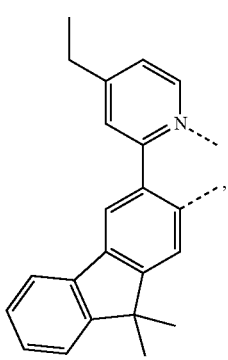
L_a-317

L<sub>a-318</sub> 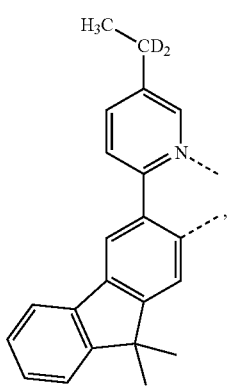
L<sub>a-319</sub> 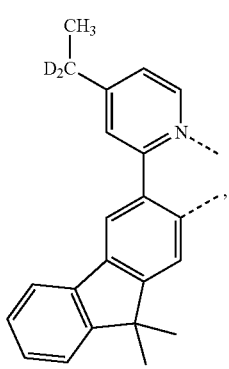
L<sub>a-320</sub> 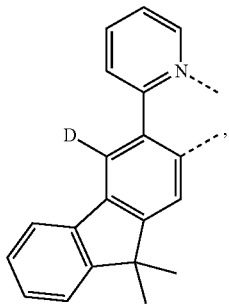
L<sub>a-321</sub> 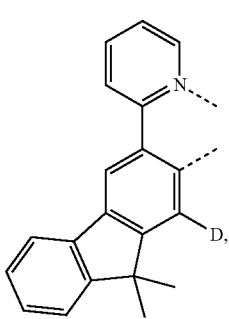
L<sub>a-322</sub> 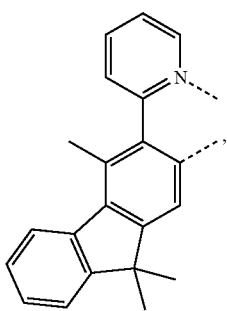
L<sub>a-323</sub> 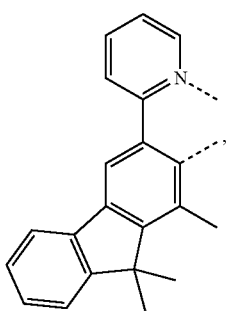
L<sub>a-324</sub> 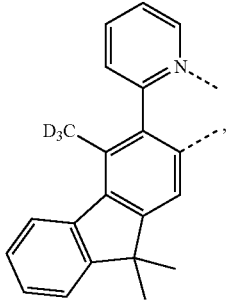
L<sub>a-325</sub> 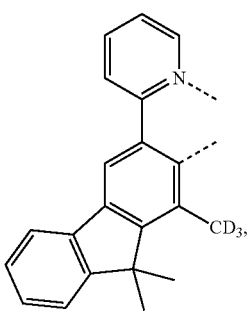
L<sub>a-326</sub> 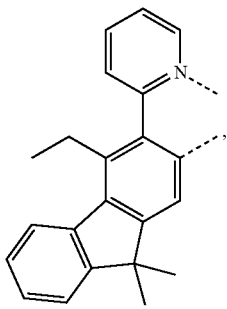

L<sub>a-327</sub> 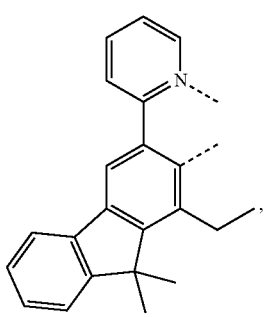
L<sub>a-328</sub> 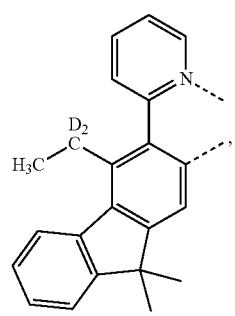
L<sub>a-329</sub> 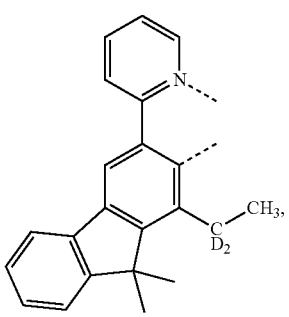
L<sub>a-330</sub> 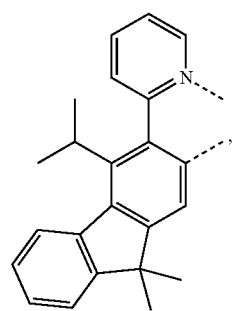
L<sub>a-331</sub> 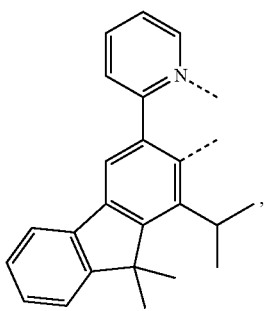
L<sub>a-332</sub> 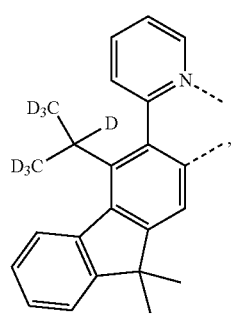
L<sub>a-333</sub> 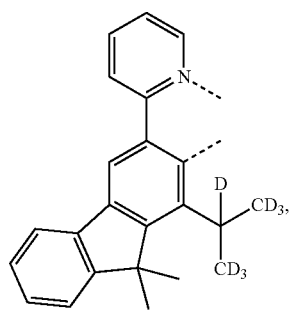
L<sub>a-334</sub> 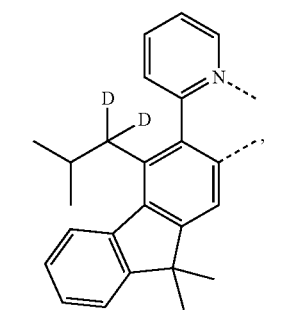
L<sub>a-335</sub> 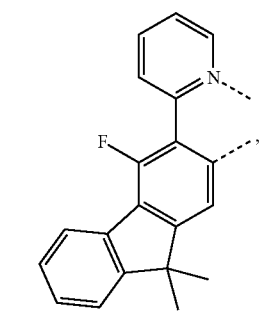
L<sub>a-336</sub> 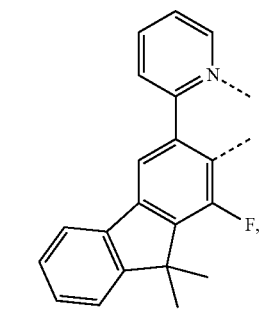

L<sub>a</sub>-337 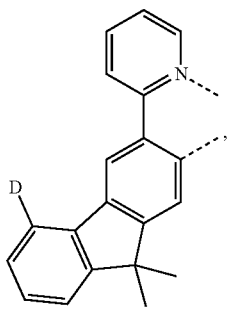
L<sub>a</sub>-338 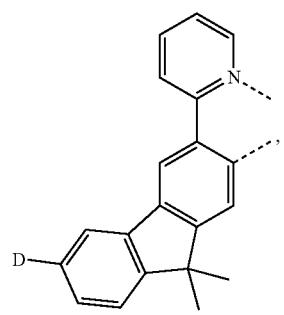
L<sub>a</sub>-339 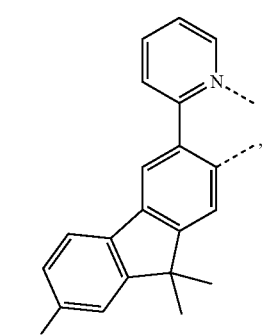
L<sub>a</sub>-340 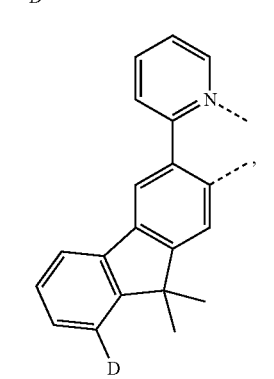
L<sub>a</sub>-341 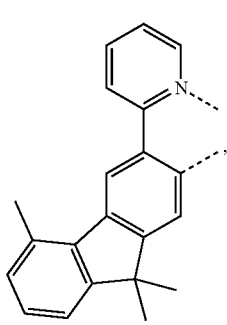
L<sub>a</sub>-342 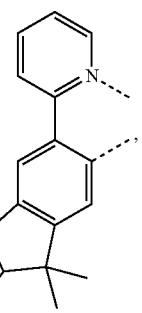
L<sub>a</sub>-343 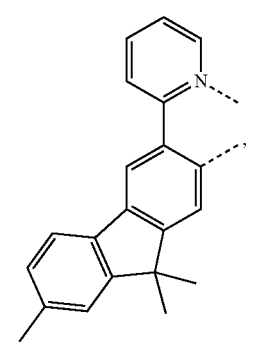
L<sub>a</sub>-344 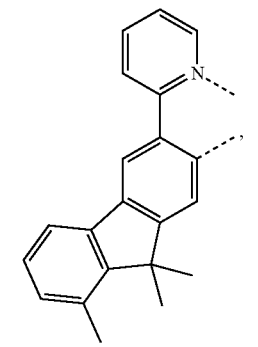
L<sub>a</sub>-345 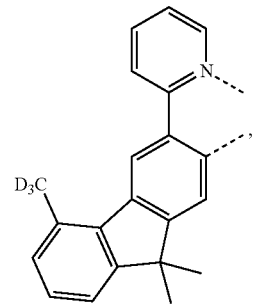
L<sub>a</sub>-346 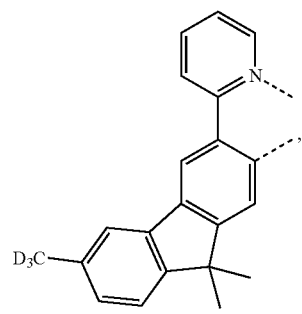

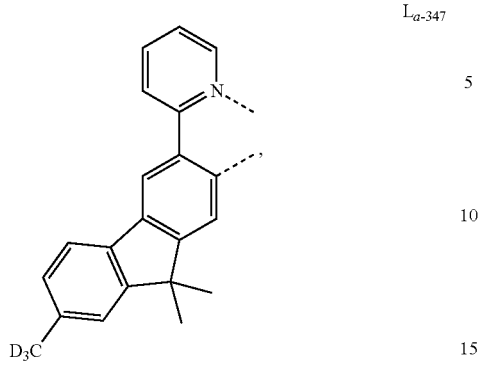
L<sub>a-347</sub>
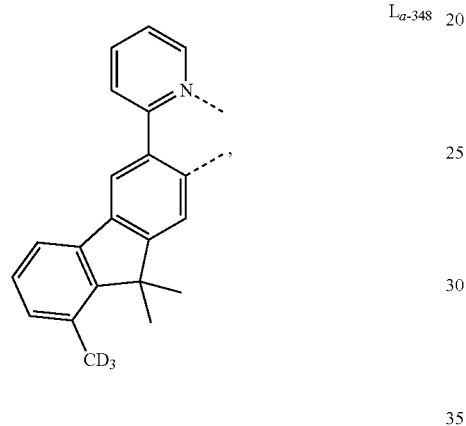
L<sub>a-348</sub>
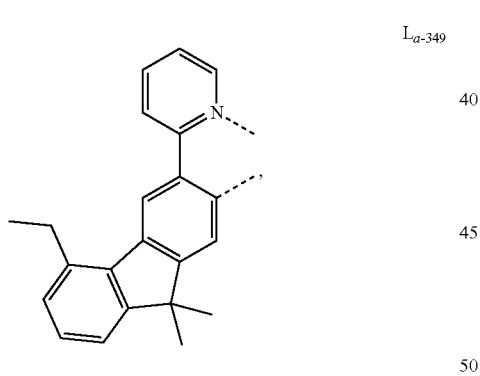
L<sub>a-349</sub>
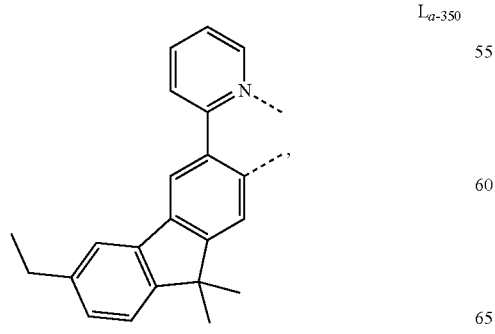
L<sub>a-350</sub>
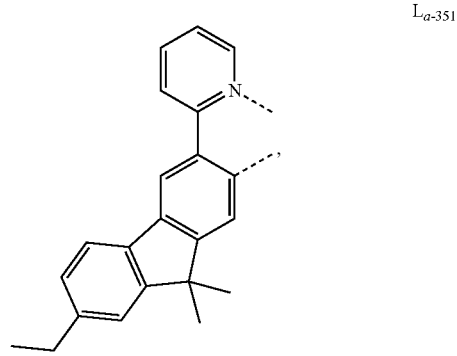
L<sub>a-351</sub>
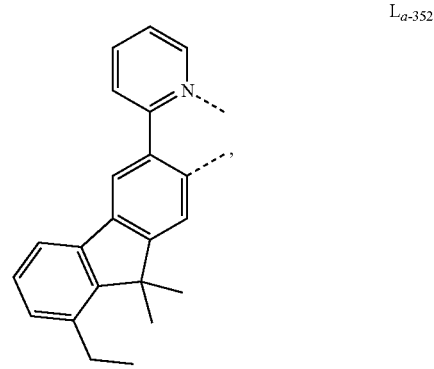
L<sub>a-352</sub>
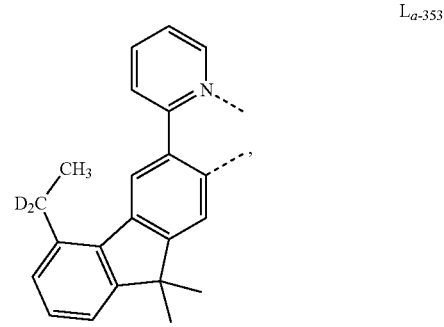
L<sub>a-353</sub>
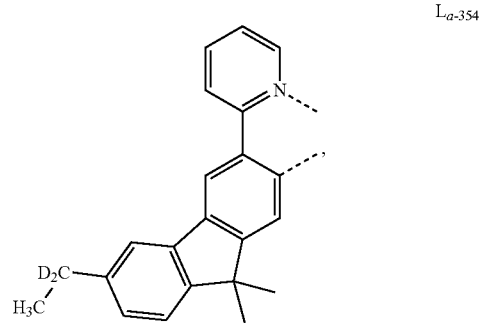
L<sub>a-354</sub>

L<sub>a-355</sub>
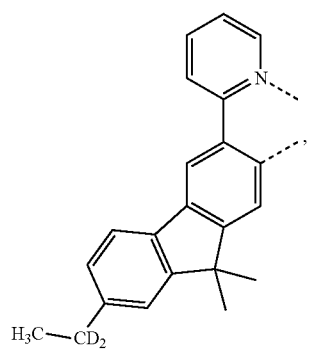
L<sub>a-356</sub>
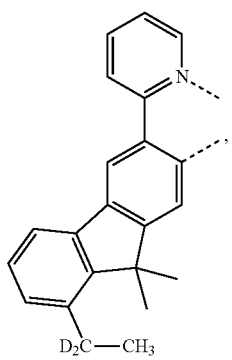
L<sub>a-357</sub>
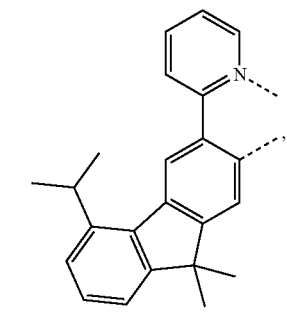
L<sub>a-358</sub>
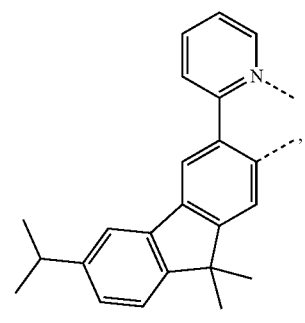
L<sub>a-359</sub>
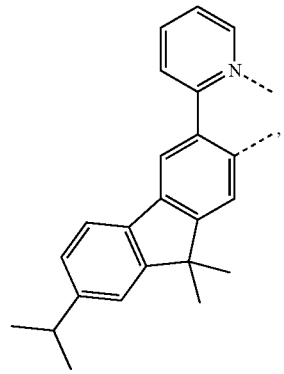
L<sub>a-360</sub>
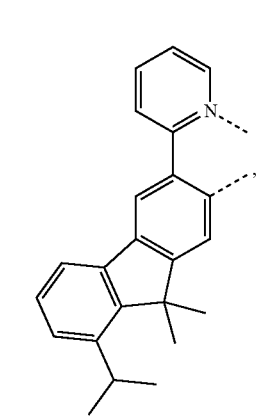
L<sub>a-361</sub>
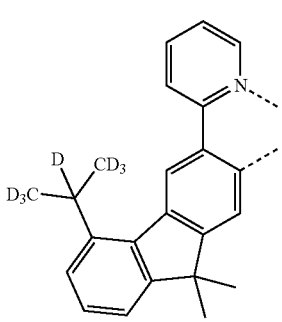
L<sub>a-362</sub>
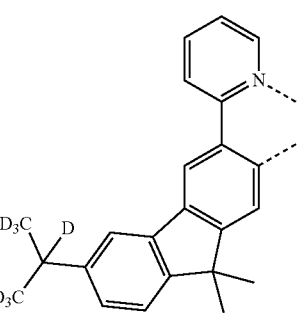

L<sub>a-363</sub>
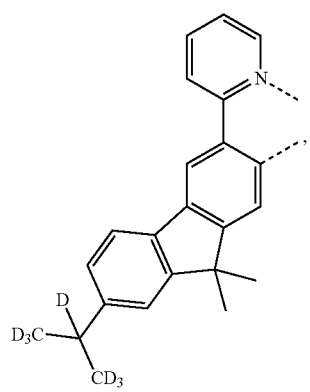
L<sub>a-364</sub>
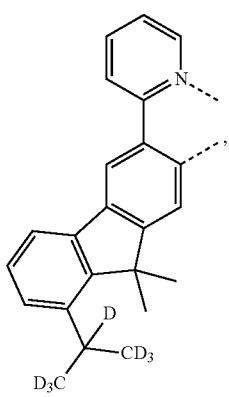
L<sub>a-365</sub>
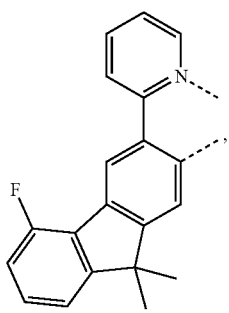
L<sub>a-366</sub>
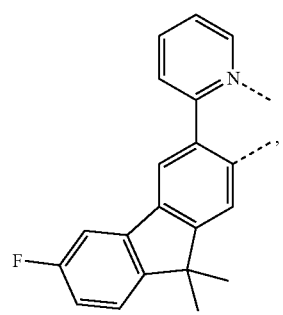
L<sub>a-367</sub>
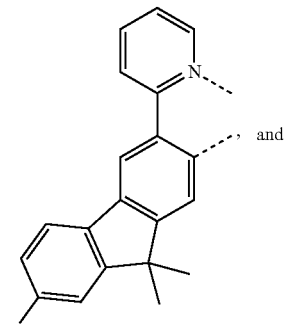, and
L<sub>a-368</sub>
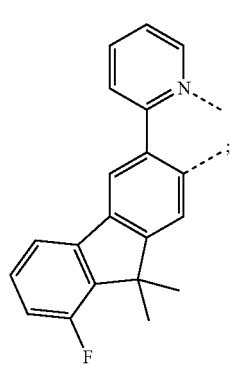
wherein $L_b$ is, at each occurrence identical or differently, selected from the group consisting of:
L<sub>b-18</sub>
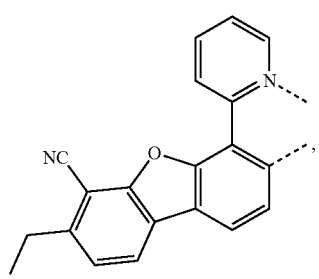
L<sub>b-101</sub>
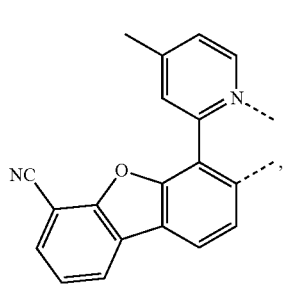, -continued

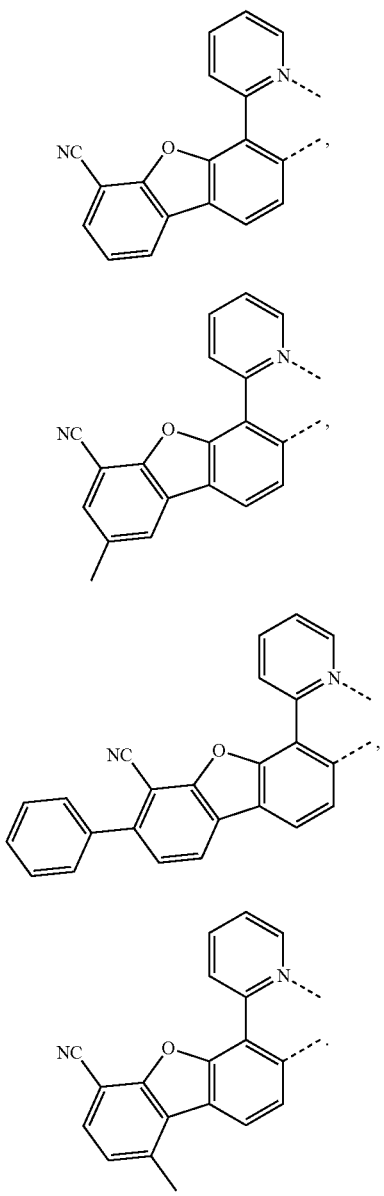

L<sub>b-102</sub>

L<sub>b-118</sub>

L<sub>b-119</sub>

L<sub>b-121</sub>

7. The metal complex according to claim 6, wherein the metal complex complex is selected from the group consisting of Compound 310, Compound 177, Compound 329, Compound 196, Compound 348, Compound 215, Compound 367, Compound 234, Compound 386, Compound 253, Compound 405, Compound 272, Compound 424, Compound 291, Compound 747, Compound 614, Compound 766, Compound 633, Compound 785, Compound 652, Compound 804, Compound 671, Compound 823, Compound 842, Compound 709, Compound 861, and Compound 728;
wherein in Compound 310, Compound 177, Compound 329, Compound 196, Compound 348, Compound 215, Compound 367, Compound 234, Compound 386, Compound 253, Compound 405, Compound 272, Compound 424, Compound 291, Compound 747, Compound 614, Compound 766, Compound 633, Compound 785, Compound 652, Compound 804, Compound 671, Compound 823, Compound 842, Compound 709, Compound 861, and Compound 728 two $L_a$ are the same, and $L_a$ and $L_b$ are respectively and correspondingly selected from ligands listed in the following table:

| Compound No. | $L_a$ | $L_b$ | Compound No. | $L_a$ | $L_b$ |
|---|---|---|---|---|---|
| 310 | $L_{a-303}$ | $L_{b-102}$ | 747 | $L_{a-303}$ | $L_{b-102}$ |
| 177 | $L_{a-295}$ | $L_{b-102}$ | 614 | $L_{a-295}$ | $L_{b-102}$ |
| 329 | $L_{a-307}$ | $L_{b-102}$ | 766 | $L_{a-307}$ | $L_{b-102}$ |
| 196 | $L_{a-296}$ | $L_{b-102}$ | 633 | $L_{a-296}$ | $L_{b-102}$ |
| 348 | $L_{a-314}$ | $L_{b-102}$ | 785 | $L_{a-314}$ | $L_{b-102}$ |
| 215 | $L_{a-297}$ | $L_{b-102}$ | 652 | $L_{a-297}$ | $L_{b-102}$ |
| 367 | $L_{a-338}$ | $L_{b-102}$ | 804 | $L_{a-338}$ | $L_{b-102}$ |
| 234 | $L_{a-298}$ | $L_{b-102}$ | 671 | $L_{a-298}$ | $L_{b-102}$ |
| 386 | $L_{a-343}$ | $L_{b-102}$ | 823 | $L_{a-343}$ | $L_{b-102}$ |
| 253 | $L_{a-299}$ | $L_{b-102}$ | 842 | $L_{a-363}$ | $L_{b-102}$ |
| 405 | $L_{a-363}$ | $L_{b-102}$ | 709 | $L_{a-300}$ | $L_{b-102}$ |
| 272 | $L_{a-300}$ | $L_{b-102}$ | 861 | $L_{a-367}$ | $L_{b-102}$ |
| 424 | $L_{a-367}$ | $L_{b-102}$ | 728 | $L_{a-302}$ | $L_{b-102}$ |
| 291 | $L_{a-302}$ | $L_{b-102}$. | | | |

8. An electroluminescent device, comprising:
an anode,
a cathode, and
an organic layer disposed between the anode and the cathode, wherein the organic layer comprises the metal complex according to claim 1.

9. The electroluminescent device according to claim 8, wherein the organic layer is an emissive layer, and the compound is an emissive material and the organic layer further comprises a host material.

10. The electroluminescent device according to claim 9, wherein the host material comprises at least one chemical group selected from the group consisting of: benzene, biphenyl, pyridine, pyrimidine, triazine, carbazole, azacarbazole, indolocarbazole, dibenzothiophene, azadibenzothiophene, dibenzofuran, azadibenzofuran, dibenzoselenophene, azadibenzoselenophene, triphenylene, azatriphenylene, fluorene, silafluorene, naphthalene, quinoline, isoquinoline, quinazoline, quinoxaline, phenanthrene, azaphenanthrene, and combinations thereof.

11. The electroluminescent device according to claim 8, wherein the electroluminescent device is incorporated into a device in the group consisting of: consumer products, electronic element modules, organic light-emitting devices, and lighting panels.

12. A compound formulation, comprising the metal complex according to claim 1.

13. The metal complex according to claim 1, wherein $R_w$ and $R_y$ are, at each occurrence identically or differently, selected from the group consisting of:
hydrogen, deuterium, fluorine, methyl, ethyl, isopropyl, isobutyl, t-butyl, cyano, and combinations thereof.

14. The metal complex according to claim 1, wherein $R_u$, $R_v$, $R_x$, and $R_z$, are, at each occurrence identically or differently, selected from the group consisting of: hydrogen, deuterium, fluorine, methyl, ethyl, isopropyl, isobutyl, t-butyl, phenyl, cyano, and combinations thereof, with the proviso that the $R_u$ associated with $U_1$ is a cyano group; and
R is, at each occurrence identically or differently, selected from the group consisting of: hydrogen, methyl, ethyl, isopropyl, isobutyl, t-butyl, and combinations thereof.

* * * * *

UNITED STATES PATENT AND TRADEMARK OFFICE
CERTIFICATE OF CORRECTION

PATENT NO. : 12,389,790 B2  
APPLICATION NO. : 17/248964  
DATED : August 12, 2025  
INVENTOR(S) : Tao Wang et al.

Page 1 of 1

It is certified that error appears in the above-identified patent and that said Letters Patent is hereby corrected as shown below:

In the Claims

In Column 29, Line 65, Claim 1, delete "Wherein," and insert -- wherein, --, therefor.
In Column 30, Line 22, Claim 1, delete "3 to 30 carbon atoms, and" and insert -- 3 to 30 carbon atoms, a cyano group, and --, therefor.
In Column 30, Line 60, Claim 3, delete "consisting of" and insert -- consisting of: --, therefor.
In Column 31, Line 3, Claim 5, delete "consisting of" and insert -- consisting of: --, therefor.
In Column 48, Line 38, Claim 6, delete "identical" and insert -- identically --, therefor.
In Column 49, Line 50, Claim 7, delete "complex complex" and insert -- complex --, therefor.
In Column 50, Line 21, Claim 7, delete "$L_{b\text{-}102}$." and insert -- $L_{b\text{-}102}$ --, therefor.

Signed and Sealed this  
Eighteenth Day of November, 2025

John A. Squires  
*Director of the United States Patent and Trademark Office*